(12) United States Patent (10) Patent No.: US 9,030,732 B2
Strohkendl (45) Date of Patent: May 12, 2015

(54) SUPPRESSION OF AMPLIFIED SPONTANEOUS EMISSION (ASE) WITHIN LASER PLANAR WAVEGUIDE DEVICES

(71) Applicant: Raytheon Company, Waltham, MA (US)

(72) Inventor: Friedrich Strohkendl, Santa Monica, CA (US)

(73) Assignee: Raytheon Company, Waltham, MA (US)

( * ) Notice: Subject to any disclaimer, the term of this patent is extended or adjusted under 35 U.S.C. 154(b) by 0 days.

(21) Appl. No.: 13/796,309

(22) Filed: Mar. 12, 2013

(65) Prior Publication Data

US 2014/0268309 A1 Sep. 18, 2014

(51) Int. Cl.
*H01S 3/06* (2006.01)
*H01S 3/063* (2006.01)
(Continued)

(52) U.S. Cl.
CPC ............ *H01S 3/0606* (2013.01); *H01S 3/0632* (2013.01); *H01S 3/063* (2013.01); *G02B 6/10* (2013.01); *H01S 3/1608* (2013.01); *H01S 3/161* (2013.01); *H01S 3/1611* (2013.01);
(Continued)

(58) Field of Classification Search
CPC ..... H01S 3/063; H01S 3/0632; H01S 3/0635; H01S 3/0637
USPC .......................................................... 372/66
See application file for complete search history.

(56) References Cited

U.S. PATENT DOCUMENTS 3,577,093 A * 5/1971 Simpson .......................... 372/97
3,639,855 A * 2/1972 Dillon et al. .................... 372/27
(Continued)

FOREIGN PATENT DOCUMENTS

GB 2432253 A 5/2007
JP 2009277943 A 11/2009

OTHER PUBLICATIONS

Sridharan et al.; "Zigzag Slabs for Solid-State Laser Amplifiers: Batch Fabrication and Parasitic Oscillation Suppression"; Applied Optics; vol. 45, No. 14, pp. 3340-3351 (May 10, 2006).
(Continued)

*Primary Examiner* — Ari M Diacou
(74) *Attorney, Agent, or Firm* — Burns & Levinson LLP; Joseph M. Maraia

(57) ABSTRACT

Described herein are devices and techniques for suppressing parasitic modes in planar waveguide amplifier structures. One or more of the side and end facets of a planar waveguide amplifier are angled with respect to a fast axis defined in a transverse plane perpendicular to a core region. A relationship between glancing in-plane angles of incidence and threshold bevel angles $\theta_T$ can be used to select side bevel angles $\theta_S$ to suppress parasitics by redirecting amplified spontaneous emission (ASE) from the core. It is possible to select the one or more bevel angles $\theta_S$ to be great enough to substantially redirect all but ballistic photons of any guided modes, effectively narrowing a numerical aperture of the planar waveguide amplifier along a slow axis, defined in a transverse plane perpendicular to the fast axis. Beneficially, such improvements can be realized for three part waveguide structures (e.g., cladding-core-cladding), with substantially smooth edge facets.

18 Claims, 12 Drawing Sheets

(51) Int. Cl.
*G02B 6/10* (2006.01)
*H01S 3/16* (2006.01)
*H01S 5/028* (2006.01)
*H01S 5/50* (2006.01)

(52) U.S. Cl.
CPC ............ *H01S 3/1616* (2013.01); *H01S 3/1618* (2013.01); *H01S 3/1623* (2013.01); *H01S 5/028* (2013.01); *H01S 2301/02* (2013.01); *H01S 3/0625* (2013.01); *H01S 5/50* (2013.01); *H01S 3/0612* (2013.01); *H01S 3/0615* (2013.01)

(56) References Cited

U.S. PATENT DOCUMENTS

| | | | | |
|---|---|---|---|---|
| 4,642,809 | A | * | 2/1987 | Petheram ........................ 372/66 |
| 4,918,703 | A | * | 4/1990 | Kukla ............................. 372/66 |
| 5,455,838 | A | * | 10/1995 | Heritier et al. .................. 372/75 |
| 5,479,430 | A | * | 12/1995 | Shine et al. ..................... 372/66 |
| 5,504,772 | A | * | 4/1996 | Deacon et al. ................. 372/102 |
| 5,555,254 | A | * | 9/1996 | Injeyan et al. .................. 372/33 |
| 5,764,681 | A | * | 6/1998 | Ballantyne et al. ............. 372/94 |
| 5,850,407 | A | * | 12/1998 | Grossman et al. .............. 372/22 |
| 6,289,032 | B1 | * | 9/2001 | Fay et al. ....................... 372/102 |
| RE37,809 | E | * | 7/2002 | Deacon et al. ................. 372/102 |
| 6,487,233 | B2 | * | 11/2002 | Maleki et al. .................. 372/108 |
| 6,567,452 | B2 | * | 5/2003 | Byren et al. .................... 372/66 |
| 6,625,194 | B1 | * | 9/2003 | Kaneda ........................... 372/71 |
| 6,785,304 | B2 | | 8/2004 | Filgas |
| 6,873,639 | B2 | * | 3/2005 | Zhang ............................. 372/69 |
| 7,123,634 | B2 | * | 10/2006 | Rothenberg et al. ........... 372/27 |
| 7,280,571 | B2 | * | 10/2007 | Rothenberg .................... 372/35 |
| 7,376,167 | B2 | * | 5/2008 | Yu ................................... 372/94 |
| 7,515,625 | B2 | * | 4/2009 | Ishizu ............................. 372/66 |
| 7,590,160 | B2 | * | 9/2009 | Manni ............................. 372/66 |
| 2002/0105997 | A1 | * | 8/2002 | Zhang ............................. 372/70 |
| 2003/0002773 | A1 | * | 1/2003 | Parker et al. ................... 385/15 |
| 2003/0137722 | A1 | * | 7/2003 | Nikolajsen et al. ......... 359/341.1 |
| 2006/0268395 | A1 | * | 11/2006 | Steckl et al. ................ 359/341.1 |
| 2007/0019701 | A1 | * | 1/2007 | Sherstobitov et al. .......... 372/95 |
| 2009/0097524 | A1 | * | 4/2009 | Thibault et al. ................. 372/70 |
| 2010/0303120 | A1 | | 12/2010 | Yamamoto et al. |

OTHER PUBLICATIONS

Thomson, I.J., "Efficient Operation of a 400 W Diode Side-Pumped Yb:YAG Planar Waveguide Laser", IEEE Journal of Quantum Electronics, vol. 47, Issue 10, pp. 1336-1345, Sep. 1, 2011.

* cited by examiner

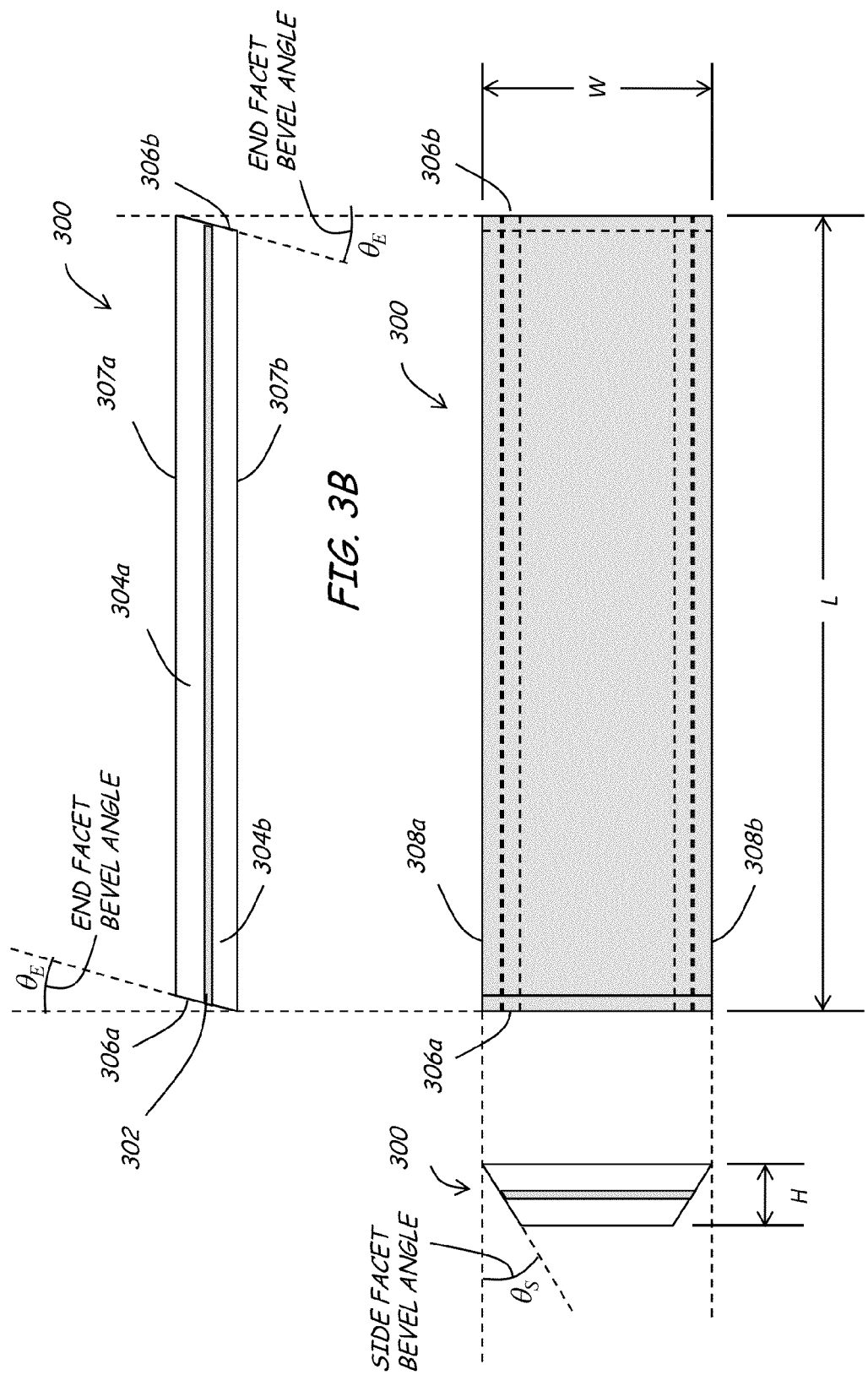

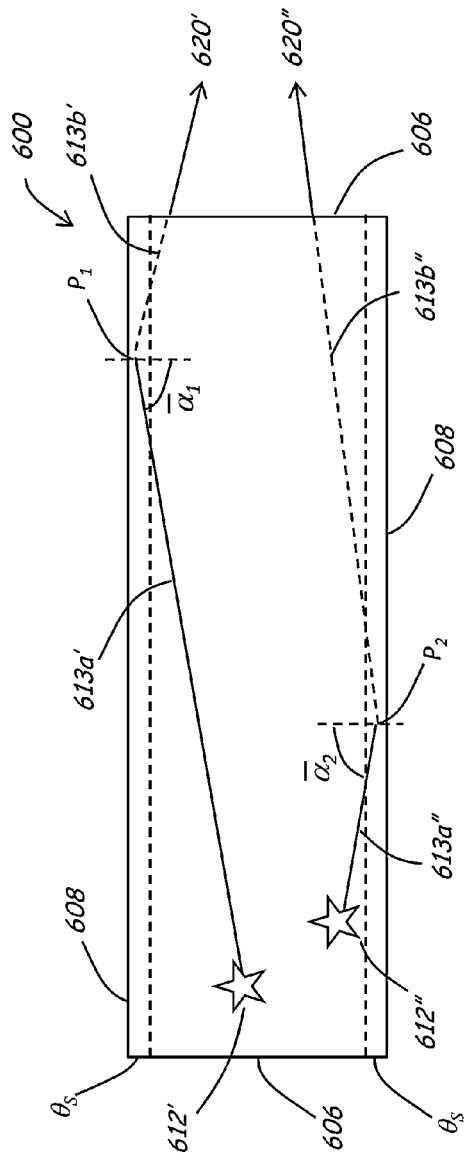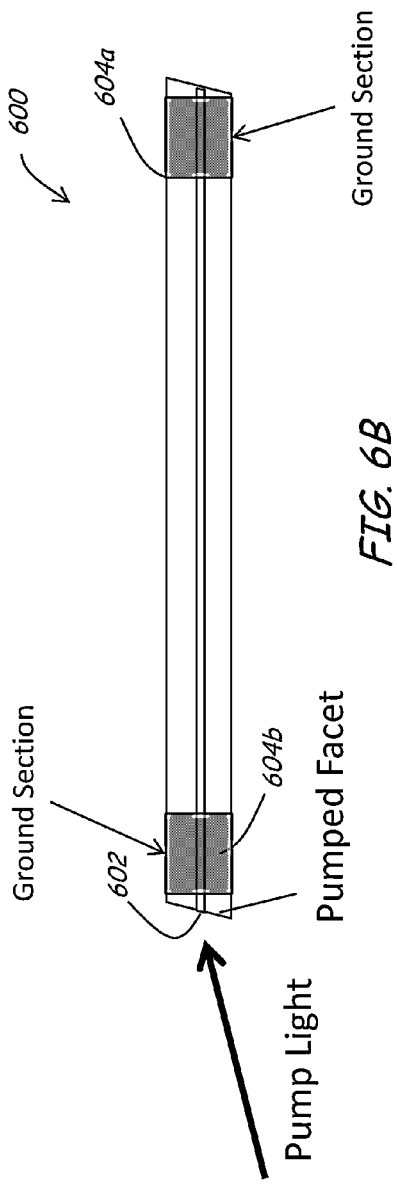
FIG. 6A
FIG. 6B

SUPPRESSION OF AMPLIFIED SPONTANEOUS EMISSION (ASE) WITHIN LASER PLANAR WAVEGUIDE DEVICES

TECHNICAL FIELD

The present disclosure relates generally to the field of optical waveguide amplifiers. More particularly, this application relates to the technology of dielectric planar waveguide amplifiers.

BACKGROUND

A dielectric waveguide is a physical structure configured to confine electromagnetic radiation transversely so as to guide the radiation in a preferred direction. As shown in FIG. 1C, this preferred direction is referred to as the optical axis 114.

A particular class of such waveguides is characterized as planar waveguide amplifiers. Such planar waveguide amplifiers include at least three stacked layers of materials (e.g., cladding-core-cladding), with at least one layer (e.g., core) having a different refractive index than other adjacent layers. The cladding layers may or may not be equal in size or material with the only requirement that their respective refractive indexes are smaller than the core index. One or more of the layers could for example be air. In operation, electromagnetic radiation is confined substantially within a core region of such a planar waveguide by total internal reflection (TIR), as can be realized by providing a middle layer having a refractive index that is larger than the refractive indexes of the surrounding layers or regions. The surrounding regions of such structures can be referred to as a cladding with respect to the core.

An example of a planar waveguide 100 is illustrated in FIG. 1A, having a rectangular planar core layer 102 sandwiched between upper and lower rectangular planar cladding layers 104a, 104b. Propagating waveguide modes in such structures 100 can be excited by injecting electromagnetic radiation into the core layer 102 from an edge of the device. In rectangular configurations, the core 102 represents a rectangular guiding plane bounded by two opposing end facets 106a, 106b (generally 106) spaced apart along a longitudinal axis (e.g., an optical axis 114) and two opposing side facets 108a, 108b (generally 108) spaced apart along a transverse axis, such that the side facets 108 are parallel to the longitudinal axis. Electromagnetic energy (e.g., a signal) directed along the longitudinal axis, generally enters and exits such a rectangular planar waveguide slab through the end facets 106.

Ideally, only signal beams would propagate within the core layer 102 and those beams would propagate along a trajectory parallel to the optical axis 114. However, both signal beams and fluorescence beams typically propagate within the core layer 102 and there are typically many beams of each type which do not propagate parallel to the optical axis 114. The angles of various signal and/or fluorescence beams relative to the optical axis 114 and/or planar core layer are referred to as beam angles ($\alpha$ as shown in FIG. 1C). In-plane beam angles (i.e., parallel to the planar core layer 102 but angled relative to the optical axis are generally expressed as $\alpha$. Out-of-plane beam angles (i.e., parallel to the optical axis 114 but angled relative to the planar core layer 102) are generally expressed as $\gamma$. The angles of various signal and/or fluorescence beams relative to the side and/or cladding layers are referred to as angles of incidence ($\bar{\alpha}$ as shown in FIG. 1C). In-plane and out of plane angles of incidence are generally expressed as $\bar{\alpha}$ and $\bar{\gamma}$ respectively.

Advantageously, such dielectric waveguide devices can be configured as amplifiers, exhibiting high-gain, high-power and high-energy capabilities. For example, planar waveguide amplifiers include a so called gain medium in the guiding layer. The gain medium is configured to provide amplification to injected electromagnetic radiation, for example, through a process generally known as stimulated emission. A pump source provides energy to the gain medium, urging electrons or molecules of the gain medium into an excited state. Interaction of injected electromagnetic radiation (i.e., signal photons) with the excited (i.e., pumped) gain medium results in the generation of photons through transitions of electrons or molecules from the excited energy state to a lower energy state. Thus, electromagnetic energy injected into one end of such a rectangular planar waveguide amplifier will travel along the core region, being amplified along the way by the generation of additional photons through stimulated emission.

The signal gain achievable in such devices depends at least in part on the available population of excited electrons or molecules. Unfortunately, in a pumped gain medium some photons are emitted spontaneously (referred to as fluorescence), independent of the signal field. A schematic example of a guided fluorescence photon 112 is shown in FIG. 1B. Spontaneously emitted fluorescence photons can occur at random locations within the gain medium, having random directions and random polarizations. Such fluorescence photons traveling within a pumped gain medium can give rise to further unwanted photons through stimulated emission (e.g., amplified spontaneous emission, or ASE) and are generally referred to as "parasitic" or "parasitic modes." It should be appreciated that stimulated photons take on the same phase, frequency, polarization and direction characteristics as the stimulating photons, regardless of whether the stimulating photons are signal photons or fluorescent photons. Accordingly, such parasitic modes (e.g., ASE) reduce the number of excited electrons or molecules available for amplifying the signal, thereby reducing the achievable gain for any given pumping power.

There are two classes of fluorescence photons, (1) photons which are emitted under shallow angles relative to the waveguide plane such that they remain confined/guided by the waveguide, and (2) photons which are emitted under large enough angles relative to the waveguide plane, such that they can reach the cladding directly. Guided fluorescence photons are particularly damaging. In their worst form, they can form in-plane TIR (TIR=Total internal Reflection) loops (e.g., the loop contains reflections from the two side facets 108 and two end facets 106). Less severe, but still damaging to the performance of a planar waveguide amplifier are guided fluorescence photons which travel from end-facet to end-facet of the waveguide and possibly reflecting off the long sides while doing so.

Typically, gain in a pumped gain medium is limited at low pump power by the fluorescence lifetime of the excited state and, at higher powers, by parasitic modes. Among these parasitic modes are modes which reflect off the sides of the amplifier structure (reflective modes) and those where the light propagates directly from end-facet to end-facet (ballistic modes). Of the reflective modes, it is the modes where all reflections occur under total internal reflection (TIR) conditions which are particularly damaging to amplifier performance.

It is possible for amplified spontaneous emission originating near an end facet and travelling through the full length of the amplifier to ultimately limit the gain achievable at a given pump power. As shown in FIG. 2, a spontaneously emitted photon 212 in a waveguide amplifier 200 can give rise to parasitic modes in the form of total internal reflection (TIR) loops. In the illustrative example, a photon 212 is generated within a core region 202 of a planar rectangular waveguide amplifier 200. The photon 212 is directed generally along a ray 213, which in the illustrative example is guided through the core 202. Such guided photons 212 propagate through the core 202 until they encounter one of the side facets 208a, 208b or end facets 206a, 206b. In the illustrative example, the photon 212 encounters the right side facet 208b at an in-plane (i.e., within the plane of the core 202) angle of incidence $\bar{\alpha}$. In at least some instances (e.g., if $\bar{\alpha}$ is larger than a threshold angle of incidence for a core-air interface), the photon 212 is fully reflected back into the core 202. The threshold angle of incidence for the core-air interface can be determined as $$\bar{\alpha} = \operatorname{asin}\left(\frac{n_{air}}{n_{core}}\right),$$

wherein $n_{core}$ is the refractive index of c is the planar core layer 202 and $n_{air}$ is the refractive index of air.

In the illustrative example, the photon 212 traverses a width of the core 202 and encounters the left side facet 208a at substantially the same in-plane angle of incidence $\bar{\alpha}$, because both side facets are parallel and aligned with a longitudinal axis. The process may repeat until the photon ultimately encounters one of the end facets 206a, 206b at an in-plane complementary angle of incidence $\alpha=90-\bar{\alpha}$, resulting from the rectangular geometry of the waveguide amplifier 200. In at least some instances, the photon 212 is once again, reflected back into the core 202 at the end facet-air interface, as shown. In such circumstances, the photon 212 is effectively trapped within the rectangular waveguide amplifier 200 in a TIR loop. TIR loops can be supported when $\bar{\alpha}$, exceeds the critical angle for TIR. For example for rectangular YAG in air, this occurs for 33.3 deg<$\bar{\alpha}$<56.7 deg, or in general $\phi_1 \leq \bar{\alpha} \leq \phi_2$. For rectangular waveguides made from some material or combination of materials, TIR loops exist when the threshold angle $\phi_1$ for the material interface is less than 45°. If TIR loops are allowed by the prevailing materials, and since the direction and orientation of spontaneously emitted photons 212 occur randomly, it is unavoidable that some fluorescence photons 212 will be trapped in TIR loops.

Thus, photons 212 of a TIR loop are effectively trapped within the gain medium of the core 202, making endless passes through the core 202. When the core 202 is configured to provide gain, each trip through the core 202 stimulates additional photons through the process of stimulated emission as described above. In such scenarios, the stimulated photons have the same direction and thus, further contribute to further growth of the power in the TIR loop, thereby continuously reducing the available signal amplification power.

One approach for reducing non-guided ASE in waveguide amplifiers is to provide a large cladding volume relative to the core 202. The cladding can be used to draw fluorescence photons out of the gain region, thereby reducing amplified spontaneous emission.

An example of one such device, which may be referred to as a five-part device, is shown in FIG. 1A and FIG. 1B. In addition to the upper and lower claddings 104a, 104b described above, the planar waveguide amplifier 100 includes left and right side claddings 110a, 110b (generally 110). Each side cladding 110 can be adjoined to a respective one of the side facets 108. As shown in the cross section of FIG. 1B, a spontaneously emitted photon 112 occurring within a central region of the core 102, can be guided through the core 102 until it encounters one of the side facets 108, upon which it may exit the core 102 and enter the side cladding 110. Thus, such guided fluorescence can be effectively "drained away" from the planar waveguide core through the side claddings 110. Unfortunately, the addition of such side claddings 110 substantially adds to complexity and associated fabrication costs because side claddings must generally be added by additional process steps, after the planar waveguide itself has been fabricated.

Other attempts at reducing ASE without requiring side claddings 110 involve providing a diffuse finish along the side facets 108. Such a diffuse finish allows at least a fraction of ASE photons impingent upon the side facet 108 to exit the core 102. Unfortunately, the diffuse finish does not discriminate between ASE photons and signal or pump photons. Thus, using diffuse finishes is a less desirable option because it reduces the amplifier efficiency that would otherwise be achievable with polished facets.

SUMMARY

It would be desirable in dielectric waveguide amplifier applications to remove as many ASE photons as possible from the gain medium. Most advantageously, it is desirable to establish conditions where (a) all in-plane TIR modes are interrupted, and (b) all in-plane propagation of unwanted fluorescence photons from one end-facet to the other is broken. In doing so, it would also be desirable to avoid the inefficiency of diffuse finishes and to remove as many such photons as quickly as possible (e.g., upon a first encounter with any side facet or end facet).

Described herein are devices and techniques for angling edge facets of planar waveguide amplifiers, in lieu of providing separate side claddings, and in some instances diffuse finishes, for suppression of ASE. Providing suitably angled edge facets can greatly simplify the planar waveguide structure without loss in performance. With this approach, polished or partially polished angled edge facets can be used to suppress guided parasitic modes and increase efficiency, while also allowing for very high gains and very high energies to be achieved with a planar waveguide amplifier. Additionally, the implementation of suitably angled edge facets precludes any need for side claddings while offering similar or in some instances even better performance benefits.

In one aspect, at least one embodiment described herein provides a planar waveguide amplifier. The planar waveguide amplifier includes at least one cladding layer. The planar waveguide amplifier also includes a planar core layer disposed over the at least one cladding layer, each of the planar core layer and the at least one cladding layer extending longitudinally between opposing end facets of the planar waveguide amplifier and laterally between opposing side facets of the planar waveguide amplifier, the planar core layer and the at least one cladding layer being mutually adapted to support guided photons within the planar core layer, wherein at least one of the opposing side facets is angled at a bevel angle $\theta_S$ measured with respect to a plane perpendicular to the planar core layer, wherein the bevel angle $\theta_S$ is greater than a threshold bevel angle $\theta_T$, wherein $\theta_T$ is determined according to $$\theta_T = \frac{(1+K_\alpha)NA_{core}}{n_{core}},$$

wherein $NA_{core}$ is the fast-axis numerical aperture of the planar core layer, $n_{core}$ is the index of refraction of the planar core layer, and $K_\alpha$ is a scalar quantity equal to $|\gamma-\gamma_r|$, where $\gamma_r = \gamma_r(\alpha, \gamma, \theta_S) = \text{Atan}(\psi(\alpha, \gamma, \theta_S))$, where $$\psi(\alpha, \gamma, \theta) = \frac{k_r(\alpha, \gamma, \theta) \cdot n_{core}}{|k_r(\alpha, \gamma, \theta) \times n_{core}|},$$

where $k_r(\alpha, \gamma, \theta) = k(\alpha, \gamma) - 2(n_{side}(\theta) \cdot k(\alpha, \gamma)) \cdot n_{side}(\theta)$, where $$k(\alpha, \gamma) = \begin{bmatrix} \sin(\alpha) \\ \sin(\gamma) \\ \sqrt{1 - \sin(\alpha)^2 - \sin(\gamma)^2} \end{bmatrix} \text{ and } n_{side} = \begin{bmatrix} \cos(\theta) \\ \sin(\theta) \\ 0 \end{bmatrix},$$

further wherein $\bar{\alpha}$ is an angle of incidence between one or more of the opposing side facets and an in-plane trajectory of at least one photon, $\alpha$ is a complementary angle of $\bar{\alpha}$, $\gamma$ is an angle between the planar core layer and an out of plane trajectory of the at least one photon, $\theta = \theta_S$, and $K_\alpha$ monotonically increases with $\bar{\alpha}$ in the range $0 < \bar{\alpha} < 90°$.

Any of the aspects and/or embodiments described herein can include one or more of the following embodiments. In some embodiments a transverse cross section of the planar core layer and the at least one cladding layer defines a shape selected from the group of shapes consisting of: a parallelogram, a trapezoid, an isosceles trapezoid, a trapezium, an isosceles trapezium, and a right-angled trapezium. In some embodiments, at least a portion of at least one of the opposing side facets is polished. In some embodiments at least a portion of at least one of the opposing side facets has a diffused surface. In some embodiments the planar core layer is at least one of neodymium-doped yttrium aluminum garnet (Nd:YAG), ytterbium-doped yttrium aluminum garnet (Yb:YAG), erbium-doped yttrium aluminum garnet (Er:YAG), thulium-doped yttrium aluminum garnet (Tm:YAG), holmium-doped yttrium aluminum garnet (Ho:YAG), thulium-holmium-codoped yttrium aluminum garnet (Tm:Ho:YAG), or chromium-doped yttrium aluminum garnet ($Cr^{4+}$:YAG).

In some embodiments the side bevel angle is not less than about 2 degrees. In some embodiments the side bevel angle $\theta_S$ is between about 2 and 45 degrees. In some embodiments the planar waveguide amplifier also includes a lossy media for attenuating amplified spontaneous emissions, wherein the lossy media is at least one of a coating to the at least one cladding layer or impregnated within the at least one cladding layer. In some embodiments $\theta_S$ is chosen to satisfy an inequality $f_{loss} < 1$, wherein $f_{loss}$ is determined by $$f_{loss}(\varphi_2, \gamma, \theta) = \cos(\gamma_r(\varphi_2, \gamma, \theta)) \cdot \frac{n_{core}}{n_b},$$

wherein $n_b$ is the refractive index of the coating to the at least one cladding layer and $\phi_2$ is a maximum $\bar{\alpha}$ at which a total internal reflection loop of a photon is possible.

In one aspect, at least one embodiment described herein provides a method for mitigating amplified spontaneous emission in a planar waveguide amplifier. The method includes providing a planar waveguide amplifier. The planar waveguide amplifier includes at least one cladding layer. The planar waveguide amplifier also includes a planar core layer disposed over the at least one cladding layer, each of the planar core layer and the at least one cladding layer extending longitudinally between opposing end facets of the planar waveguide amplifier and laterally between opposing side facets of the planar waveguide amplifier, the planar core layer and the at least one cladding layer being mutually adapted to support guided photons within the planar core layer. The method also includes determining at least one threshold in-plane angle of incidence $\bar{\alpha}$ formed by photon trajectories impinging upon the side facet within the planar core layer, beyond which total internal reflection (TIR) within the planar core layer can be supported. The method also includes determining, from the at least one threshold in-plane angle of incidence $\bar{\alpha}$, a threshold bevel angle $\theta_T$ of one of the opposing side facets measured with respect to a plane perpendicular to the planar core layer, wherein $\theta_T$ is determined according to $$\theta_T = \frac{(1 + K_\alpha)NA_{core}}{n_{core}},$$

wherein $NA_{core}$ is the fast-axis numerical aperture of the planar core layer, $n_{core}$ is the index of refraction of the planar core layer, and $K_\alpha$ is a scalar quantity equal to $|\gamma-\gamma_r|$, where $\gamma_r(\alpha, \gamma, \theta_T) = \text{Atan}(\psi(\alpha, \gamma, \theta_T))$, where $$\psi(\alpha, \gamma, \theta) = \frac{k_r(\alpha, \gamma, \theta) \cdot n_{core}}{|k_r(\alpha, \gamma, \theta) \times n_{core}|}$$

where $k_r(\alpha, \gamma, \theta) = k(\alpha, \gamma) - 2(n_{side}(\theta) \cdot k(\alpha, \gamma)) \cdot n_{side}(\theta)$, where $$k(\alpha, \gamma) = \begin{bmatrix} \sin(\alpha) \\ \sin(\gamma) \\ \sqrt{1 - \sin(\alpha)^2 - \sin(\gamma)^2} \end{bmatrix} \text{ and } n_{side} = \begin{bmatrix} \cos(\theta) \\ \sin(\theta) \\ 0 \end{bmatrix},$$

further wherein $\bar{\alpha}$ is an angle of incidence between one or more of the opposing side facets and an in-plane trajectory of at least one photon, $\alpha$ is a complementary angle of $\bar{\alpha}$, $\gamma$ is an angle between the planar core layer and an out of plane trajectory of the at least one photon, $\theta = \theta_S$, and $K_\alpha$ monotonically increases with $\bar{\alpha}$ in the range $0 < \bar{\alpha} < 90°$. The method also includes angling at least one side facet at a bevel angle $\theta_S$ greater than the threshold bevel angle $\theta_T$.

Any of the aspects and/or embodiments described herein can include one or more of the following embodiments. In some embodiments the method also includes polishing at least one of the opposing side facets. In some embodiments the method also includes applying a diffuse finish to at least one of the opposing side facets. In some embodiments the method also includes angling both opposing side facets according to the same bevel angle $\theta_S$. In some embodiments the method also includes impregnating the at least one cladding layer with a lossy media for attenuating amplified spontaneous emissions. In some embodiments the method also includes disposing a lossy media coating over one or more of the at least one cladding layer for attenuating amplified spontaneous emissions.

The devices and techniques for angling edge facets of planar waveguide amplifiers described herein (hereinafter technology) provide one or more of the following advantages. One advantage of the technology is that the complex structures and processes associated with manufacturing high-gain planar waveguide amplifiers can be simplified, thereby advantageously reducing the cost of high-gain planar waveguide amplifiers. The technology also advantageously provides improved ASE suppression capability compared with other high-gain planar waveguide amplifiers. The technology also can be used advantageously to establish conditions where (a) all in-plane TIR modes are interrupted, and (b) all in-plane propagation of unwanted fluorescence photons from one end-facet to the other is broken. The technology can also advantageously achieve conditions (a) and (b) without the inefficient introduction of diffuse finishes to the planar waveguide amplifier, The technology can also advantageously achieve conditions (a) and (b) upon a first encounter with any side facet or end facet, rather than after multiple reflections.

BRIEF DESCRIPTION OF THE DRAWINGS

The present disclosure is further described in the detailed description which follows, in reference to the noted plurality of drawings by way of non-limiting examples of embodiments of the present disclosure, in which like reference numerals represent similar parts throughout the several views of the drawings, and wherein:

FIG. 3A is a top schematic view of an embodiment of angled planar waveguide amplifier.

FIG. 3B is a side schematic view of the angled planar waveguide amplifier shown in FIG. 3A.

FIG. 3C is a schematic transverse cross-sectional view of the angled planar waveguide amplifier shown in FIG. 3A.

FIG. 6A is a schematic diagram illustrating examples of ASE suppression within an embodiment of an ASE-resistant planar waveguide amplifier.

FIG. 6B is a schematic diagram illustrating a side view of the ASE-resistant planar waveguide amplifier shown in FIG. 6A.

DETAILED DESCRIPTION

In the following detailed description of the illustrated embodiments, reference is made to accompanying drawings, which form a part thereof, and within which are shown by way of illustration, specific embodiments, by which the subject matter may be practiced. It is to be understood that other embodiments may be utilized and structural changes may be made without departing from the scope of the disclosure.

The particulars shown herein are by way of example and for purposes of illustrative discussion of the embodiments only and are presented in the case of providing what is believed to be the most useful and readily understood description of the principles and conceptual aspects of the disclosure. In this regard, no attempt is made to show structural details of the subject matter in more detail than is necessary for the fundamental understanding of the disclosure, the description taken with the drawings making apparent to those skilled in that how the several forms of the present disclosure may be embodied in practice. Further, like reference numbers and designations in the various drawings indicate like elements.

Described herein are devices and techniques for angling side facets of rectangular planar waveguide amplifiers, in lieu of separate side claddings or diffuse finishes without such angled edges, for suppression of unwanted ASE.

Planar dielectric waveguide amplifiers may include a relatively weak core waveguide and relatively strong cladding waveguides. At least one edge facet, such as a side edge of the planar waveguide amplifier is angled or otherwise angled with respect to the fast axis at an angle sufficient to prohibit transverse lasing. Moreover, each angled edge facet is further angled beyond what is minimally necessary to prohibit transverse lasing, to dramatically reduce amplified spontaneous emission.

Improved gain performance in dielectric planar waveguide amplifiers can be achieved by providing one or more angled edge facets. In particular, such improvements can be realized when one or more of the angled edge facets are angled at a bevel angle $\theta_S$ greater than a maximum bevel angle $\theta_T$ at which a total internal reflection (TIR) loop of guided photons within the planar core layer can be supported, such that any guided photons that would otherwise give rise to a guided TIR loop are redirected into unguided modes by reflection at the angled facet.

Figure 4A:
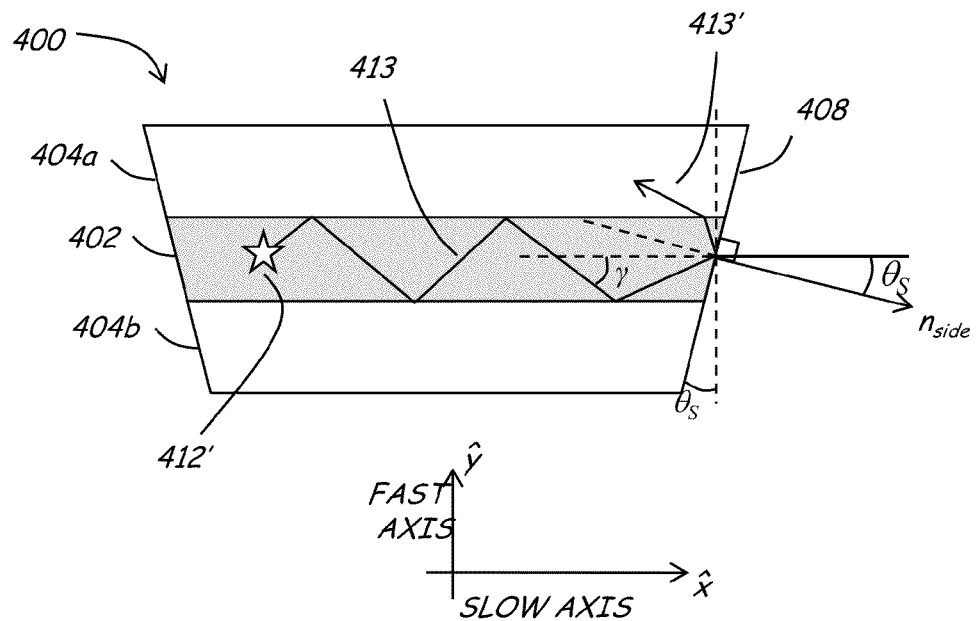
FIG. 4A is a schematic diagram illustrating in more detail, a transverse cross section of an embodiment of a rectangular, ASE-resistant planar waveguide amplifier.
Figure 4B:
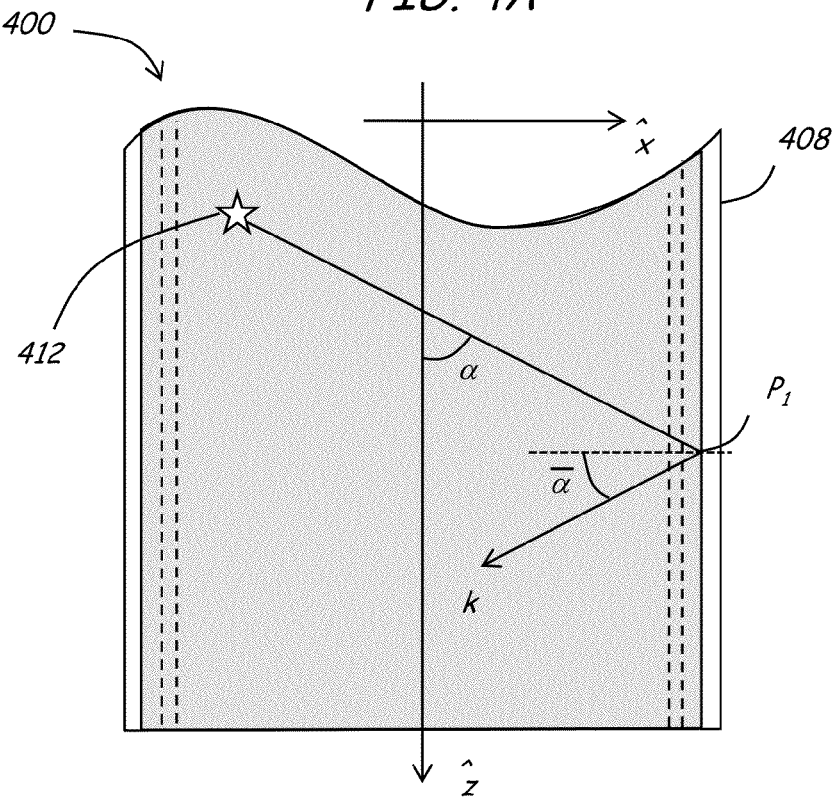
FIG. 4B is a schematic diagram illustrating in more detail, a top view of an end portion of the rectangular, ASE-resistant planar waveguide amplifier shown in FIG. 4A.

Throughout this description, a reference geometry comprising a rectangular slab, where all bounding surfaces meet at right angles is used which comprises at least one each of cladding and core layers. The devices and techniques described herein, in various embodiments, involve providing or creating an angle on these surfaces in prescribed ways (e.g., as shown in FIG. 3). Angles denoted by forms of "θ" express the angular deviation from the rectangular reference structure. $\theta_S$ is used to denote the side angles (e.g., as shown in FIG. 3C) and $\theta_E$ is used to denote the end angles (e.g., as shown in FIG. 3B). Beam angles, noted as $\alpha$, and $\gamma$ are measured relative to an optical axis and a central waveguide plane respectively. The optical axis is in the central waveguide plane (i.e., in the center of the waveguide core) where the refractive index is highest. The optical axis is parallel to the direction of preferred beam propagation (i.e., in the direction of beam propagation for which the device is designed). With reference to the trajectory of a random beam (or ray) projected onto the waveguide plane, the in-plane beam angle $\alpha$ is the angle of the projection relative to the optical axis. The value of the in-plane beam angle $\alpha$ is zero when the projection and the optical axis are parallel. For convenience we also use the angle $\bar{\alpha}$, (e.g., as shown in FIG. 4B) where $\bar{\alpha}=90$ deg$-\alpha$. The symbol $\bar{\alpha}$ is the angle of incidence (AOI) onto the narrow sides of the waveguide and may be used to describe various interactions with the sides (e.g., the effect of reflection from the sides). The angle $\gamma$ is the out of plane angle of the beam trajectory relative to the waveguide plane at a location inside the central core plane (e.g., as shown in FIG. 4A), where the refractive index has a maximum. For $\gamma=0$ the beam is parallel to the waveguide plane. The beam is in a guided state when the beam is in the core and $0 \leq \gamma \leq \gamma_g$. $\gamma_g$ is the minimum out of plane angle of the beam that is required for the beam to leave the core and enter the cladding. For convenience we also use the angle $\bar{\gamma}$, where $\bar{\gamma}=90$ deg$-\gamma$. The symbol $\bar{\gamma}$ is the angle of incidence (AOI) onto the wide sides of the waveguide. $\bar{\gamma}$ is used to describe various interactions with the wide sides. A convenient coordinate system is formed by a "Fast Axis" (FA) and a "Slow Axis" (SA) and the optical axis of the waveguide. These axes are mutually orthogonal. FA is perpendicular and SA is parallel to the waveguide plane.

Figure 10:
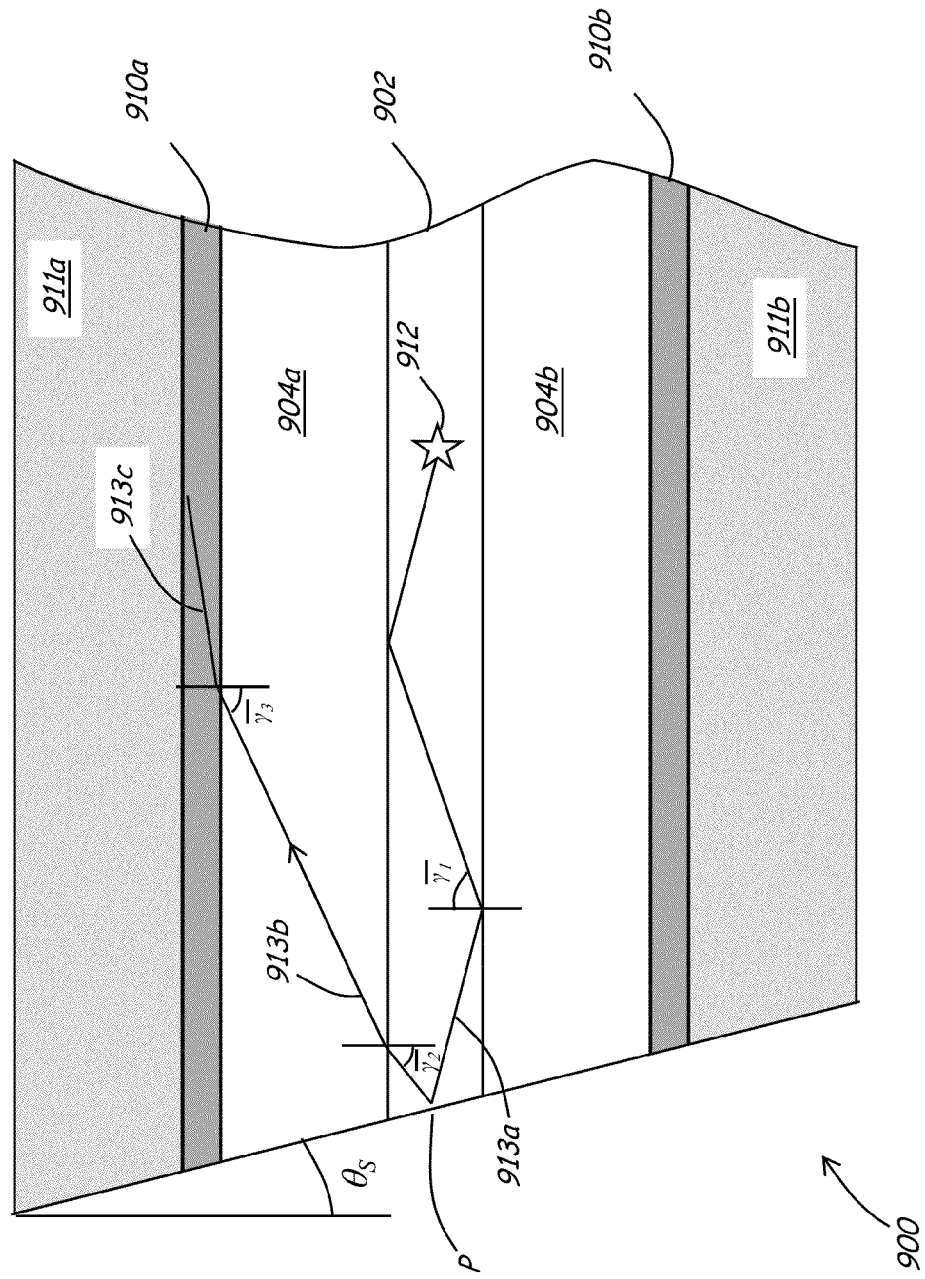
FIG. 10 is a schematic diagram illustrating in more detail, an edge portion of a transverse cross section of an embodiment of a rectangular, ASE-resistant planar waveguide amplifier.

Angles $\theta$ are used in various embodiments to reflect beams from a guided state into a non-guided state. In various embodiments (e.g., as shown in FIG. 10) the core and the cladding may be considered as two waveguides. The core waveguide may amplify the signal light, but the cladding, which is a stronger waveguide, may be used for the pump light, when cladding pumping (i.e., pump light is directed into the cladding) is employed. Because the cladding is a different waveguide having potentially different properties than the core waveguide, laser-active light which has been reflected out of a core-guided state may or may not end up in a cladding-guided state. As described in further detail below, it may be advantageous in some embodiments to set angles $\theta$ sufficient to prevent access to such cladding-guided states.

Illustrated respectively in FIGS. 3A, 3B and 3C are top, side and end schematic views of an embodiment of an angled planar waveguide amplifier 300 configured with ASE suppression.

The angled planar waveguide amplifier 300 includes at least three planar layers: a core layer 302 bounded above and below by upper and lower cladding layers 304a, 304b (generally 304). In the illustrative embodiment, the multi-layer structure forms a prism, bounded by at least six rectangular facets: front and rear edge or end facets 306a, 306b; relatively large top and bottom facets 307a, 307b; and left and right edge or side facets 308a, 308b. In the example embodiment, perimeters of the top and bottom facets 307a, 307b define elongated rectangles extending lengthwise for a distance L between the end facets 306a, 306b, and widthwise for a distance W between side facets 308a, 308b. Generally, L>W as shown, for configurations in which electromagnetic radiation is coupled through the end facets 306a, 306b. The overall height H of the rectangular planar waveguide amplifier is generally less than either L or W. In at least some embodiments, the thickness of the core 302 is substantially less than the thickness of either upper or lower claddings 304. In one example, a planar waveguide amplifier has a length of about 50 mm, a width of about 10 mm and an overall height of about 1 mm, with a core thickness of about 0.2-0.25 mm. However, it will be apparent in view of this disclosure that planar waveguide amplifiers 300 in accordance with the technology described herein may be designed with any values for L, W, or H, that L need not be greater than W, and that H need not be less than L or W. Furthermore, while the angled planar waveguide amplifier 300 illustrated in FIGS. 3A, 3B, and 3C is shown to have a rectangular planar geometry, it will be apparent in view of this disclosure that any planar waveguide geometry (e.g., hexagonal, octagonal, triangular, elliptical, etc.) will derive ASE-suppression and efficiency advantages from the angled sides of the present disclosure.

The various layers of the planar waveguide amplifier 300 can be fashioned from any dielectric materials, semiconductors, or combinations thereof. Preferably, the layers 302, 304 are selected and arranged to accommodate propagation of electromagnetic radiation, sometimes referred to as guided modes. In planar waveguide amplifier embodiments, the core layer 302 includes a gain medium. The gain medium (e.g., the core 302) can include a semiconductor, such as a group III-V compound (e.g., GaAs/AlGaAs, InP/InGaAs, InP/InGaAsP and InP/InAlGaAs), or a direct band gap semiconductor, such as a II-VI compound. Other examples of gain media include certain crystals, such as yttrium aluminum garnet (YAG), yttrium orthovanadate ($YVO_4$), or sapphire ($Al_2O_3$), typically doped with rare-earth ions, such as neodymium, ytterbium, or erbium, or transition metal ions (e.g., titanium or chromium), or any other suitable gain medium and/or dopant. Some such doped crystals are not limited to, but may include, for example, neodymium-doped yttrium aluminum garnet (Nd:YAG), ytterbium-doped yttrium aluminum garnet (Yb:YAG), erbium-doped yttrium aluminum garnet (Er:YAG), thulium-doped yttrium aluminum garnet (Tm:YAG), holmium-doped yttrium aluminum garnet (Ho:YAG), and/or chromium-doped yttrium aluminum garnet ($Cr^{4+}$:YAG).

Pump sources (not shown) can be provided to realize the intended gain in such dielectric planar waveguide amplifiers. It is generally understood that such pump sources can include one or more light sources, such as laser diodes (LD), incandescent lamps, fluorescent lamps, flash lamps, light emitting diodes (LED), and/or lasers, alone or in combination. Pumping of the gain medium (e.g., the core 302) can be accomplished by exposing one or more of the facets 306, 307, 308 to light emitted by such pump sources. For example, one or more LEDs can be configured to illuminate one or both of the elongated side facets 308, such LEDs being spaced apart along an adjacent edge. Light emitted from the LEDs preferably falls within a numerical aperture of the planar waveguide amplifier 300, to facilitate coupling of pumping energy to the core 302.

Electromagnetic radiation can be injected into the core region 302 of the planar waveguide amplifier 300 through at least one of the edge facets 306, 307. Alternatively or in addition, electromagnetic radiation is injected into one of the end facets 306a, within the numerical aperture of the planar waveguide amplifier 300 and directed generally along a longitudinal axis of the amplifier 300. The injected electromagnetic energy produces stimulated emission as it propagates along the core 302, which has been suitably pumped. Preferably, the planar waveguide amplifier 300 is configured to allow electromagnetic radiation amplified by the planar waveguide amplifier 300 to exit at an opposite end facet 306b.

In some embodiments, both end facets 306a, 306b (generally 306) are square (i.e., perpendicular to the core, having a bevel angle of 0°). Alternatively, at least one of the end facets 306 is angled or otherwise angled, with respect to a so-called fast axis, in a longitudinal plane perpendicular to the core. A so-called "slow axis" can be defined in a transverse plane within a plane of the core. In at least some examples, one of the end facets is angled at an angle to promote coupling of energy into and/or out of the planar waveguide amplifier. For example, one of the end facets 306 can be angled at an angle defined by Brewster's law (also known as Brewster's angle or the polarization angle), which is an angle of incidence at which light with a particular polarization is perfectly transmitted through a transparent dielectric surface, with no reflection (e.g., 28.8° in YAG at 1064 nm), while the opposite end facet is square. Alternatively or in addition, planar waveguide amplifier devices can include anti-reflection treatment at one or more of the end and side facets, such as anti-reflective coating to otherwise prevent the amplifier from acting as a laser.

Shown in FIGS. 4A and 4B are schematic diagrams respectively illustrating, transverse cross section and planar views of an example embodiment of an angled, ASE-resistant planar waveguide amplifier 400. The waveguide amplifier 400 includes a planar core layer 402 bounded by upper and lower cladding layers 404a, 404b. In the illustrative embodiment, the elongated side edges 408 are angled at a bevel angle θ with respect to the fast axis (i.e., y-axis).

Consider the trajectory 413 of a core-guided fluorescence photon 412' with an in-plane directional angle α=90 deg (i.e., the photon 412' propagates transversely to the optical axis of the waveguide). Such a photon 412' will be guided if its out of plane angle γ satisfies the equation $$\gamma \leq \sin^{-1}\left(\frac{NA_{core}}{n_{core}}\right),$$

wherein $NA_{core}$ is the fast-axis numerical aperture of the planar core layer 402 and $n_{core}$ is the index of refraction of the planar core layer 402. A guided transverse photon 412' will, upon reflection from the side 408, assume a new value for $\gamma=\gamma_R$. In order to insure that any guided, transversely-propagating photon 412' is no longer in a guided state upon reflection from the side 408, the equation $$\gamma_R > \sin^{-1}\left(\frac{NA_{core}}{n_{core}}\right)$$

needs to be satisfied. This is achieved for side tilts of $$\theta > \theta_T = \sin^{-1}\left(\frac{NA_{core}}{n_{core}}\right).$$

When a sufficient θ has been implemented, such redirected photons 412' will encounter the core-cladding interface at angles above a critical core-cladding interface angle, such that the photons 412' will no longer be totally internally reflected at the core-cladding interface, instead being redirected from core 402 into the cladding 404, as illustrated by ray 413'. It can be said that such an angled side 408 suppresses transverse lasing within the core 402, by "rejecting" or otherwise redirecting guided fluorescence photons 412 into the cladding 404.

The expression of threshold side angle $\theta_T$ becomes more complex when dealing with guided beams that may not be purely transverse. Referring next to FIG. 4B, an example of a photon 412 not constrained to a transverse plane, approaches the side edge 408 along an in-plane angle of incidence $\bar{\alpha}$ (i.e., within a plane of the core 402), and having an out-of-plane angle of incidence $\bar{\gamma}$ (i.e., within a plane perpendicular to the core 402). The requirement that $$\bar{\gamma} \leq \sin^{-1}\left(\frac{NA_{core}}{n_{core}}\right)$$

remains accurate for the photon to be in a guided state. However, as will be described below, the threshold bevel angle $$\theta_T = \frac{(1 + K_\alpha)NA_{core}}{n_{core}},$$

where scalar quantity $K_\alpha$ equals zero for $\bar{\alpha}=0$ and increases monotonically with $\bar{\alpha}$. In the following, $n_{side}$ corresponds to a normal unit vector of the angled side plane 408, and $n_{core}$ corresponds to a normal unit vector of the core plane 402. Expressions for $n_{side}$ and $n_{core}$ are respectively provided in Eqns. 1 and 2 below.

$$n_{side} = \begin{bmatrix} \cos(\theta) \\ \sin(\theta) \\ 0 \end{bmatrix} \qquad \text{Eqn. 1}$$

$$n_{core} = \begin{bmatrix} 0 \\ 1 \\ 0 \end{bmatrix} \qquad \text{Eqn. 2}$$

In general, the vector k corresponds to a propagation direction of the photon 412 within the core 402. An expression for the beam propagation vector k in terms of the in-plane and out-of-plane angles relative to the z-axis of FIG. 4B, α and γ is provided in Eqn. 3 below.

$$k(\alpha, \gamma) = \begin{bmatrix} \sin(\alpha) \\ \sin(\gamma) \\ \sqrt{1 - \sin(\alpha)^2 - \sin(\gamma)^2} \end{bmatrix} \qquad \text{Eqn. 3}$$

After encountering a side edge 408 angled at bevel angle θ, the propagation vector k is, upon reflection, altered into a new propagation vector $k_r$. An expression for the redirected propagation vector $k_r$ in terms of the in-plane, out-of-plane and bevel angles α, γ, θ is provided in Eqn. 4 below.

$$k_r(\alpha,\gamma,\theta) = k(\alpha,\gamma) - 2(n_{side}(\theta) \cdot k(\alpha,\gamma)) \cdot n_{side}(\theta) \qquad \text{Eqn. 4}$$

A photon 412 having encountered the angled edge 408 from within the core 402 and subsequently traveling along the redirected propagation vector $k_r$, results in a new out-of-plane angle $\gamma_r$. A relationship for the new out-of-plane angle $\gamma_r$ is provided in Eqn. 5 below.

$$\gamma_r(\alpha,\gamma,\theta) = \text{Atan}(\psi(\alpha,\gamma,\theta)) \qquad \text{Eqn. 5}$$

where $$\psi(\alpha, \gamma, \theta) = \frac{k_r(\alpha, \gamma, \theta) \cdot n_{core}}{|k_r(\alpha, \gamma, \theta) \times n_{core}|} \quad \text{Eqn. 6}$$

Eqn. 5 therefore, predicts a new out of plane angle, $\gamma_r$, after reflection. Depending on the value of $\gamma_r$, an evaluation of whether the beam is guided or non-guided after reflection (i.e., if the new $\gamma_r$ is below or above the threshold angle for guiding) can be made. Solving the equations above, it is determined that, for a given value pair of ($\gamma$, $\theta$), the change in $\gamma$, expressed as $|\gamma-\gamma_r|$, becomes smaller when $\bar{\alpha}$ is varied from zero towards 90 degrees. To compensate, an increase in $\theta$ is required to keep $\gamma_r$ at or above the threshold level. This increase in $\theta(\alpha)$ is conveniently represented by scalar quantity $K_\alpha$, which incorporates the mathematical formalism developed in Eqns. 1-6 above. From those calculations, it is shown that $K_\alpha > 0$ for $\bar{\alpha} > 0$ and that $K_\alpha$ monotonically increases with $\bar{\alpha}$ in the range $0 < \bar{\alpha} < 90°$.

Figure 1A:
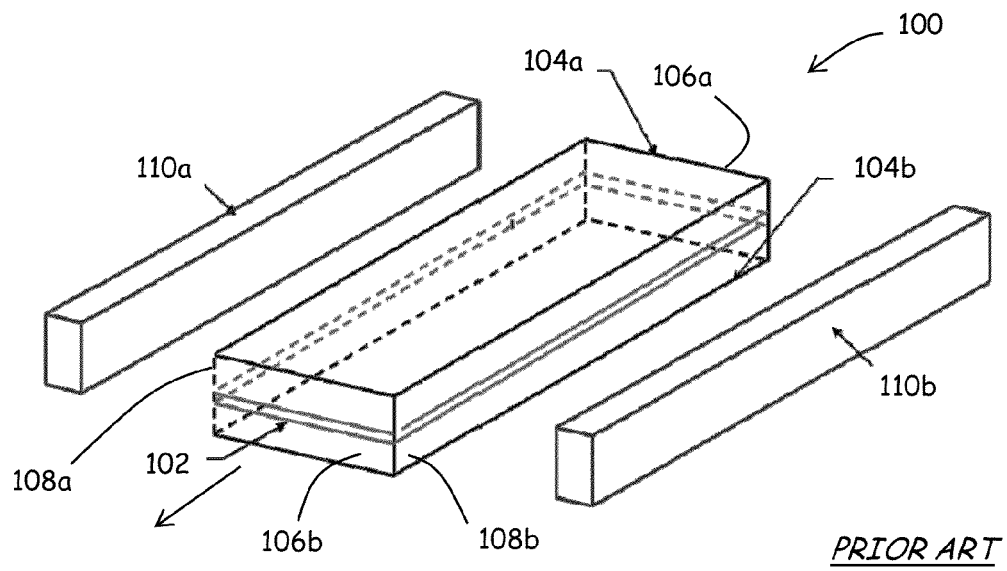
FIG. 1A is a perspective exploded view of a portion of a planar waveguide amplifier having side claddings.
Figure 1B:
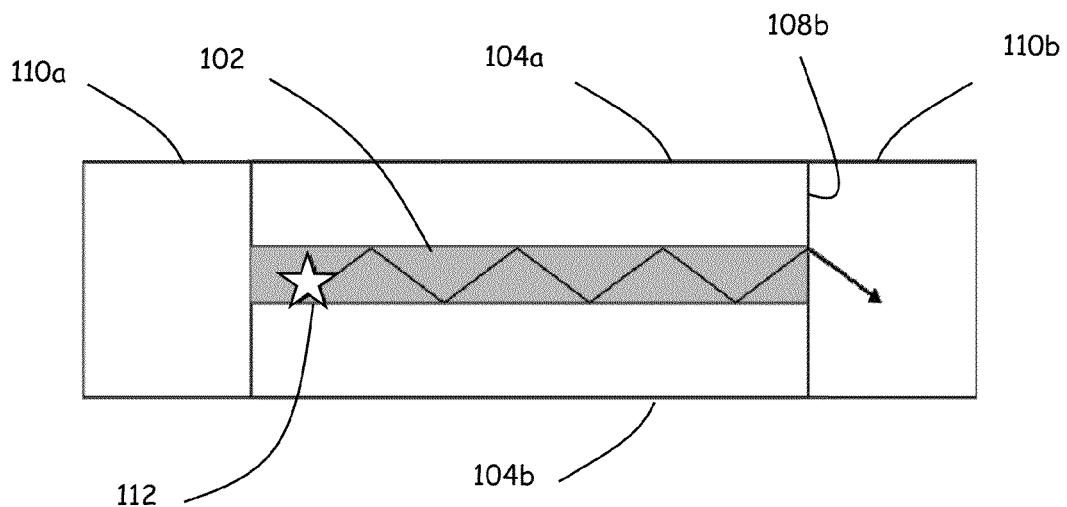
FIG. 1B is a transverse cross section of an assembled configuration of the portion of the planar waveguide amplifier shown in FIG. 1A.
Figure 1C:
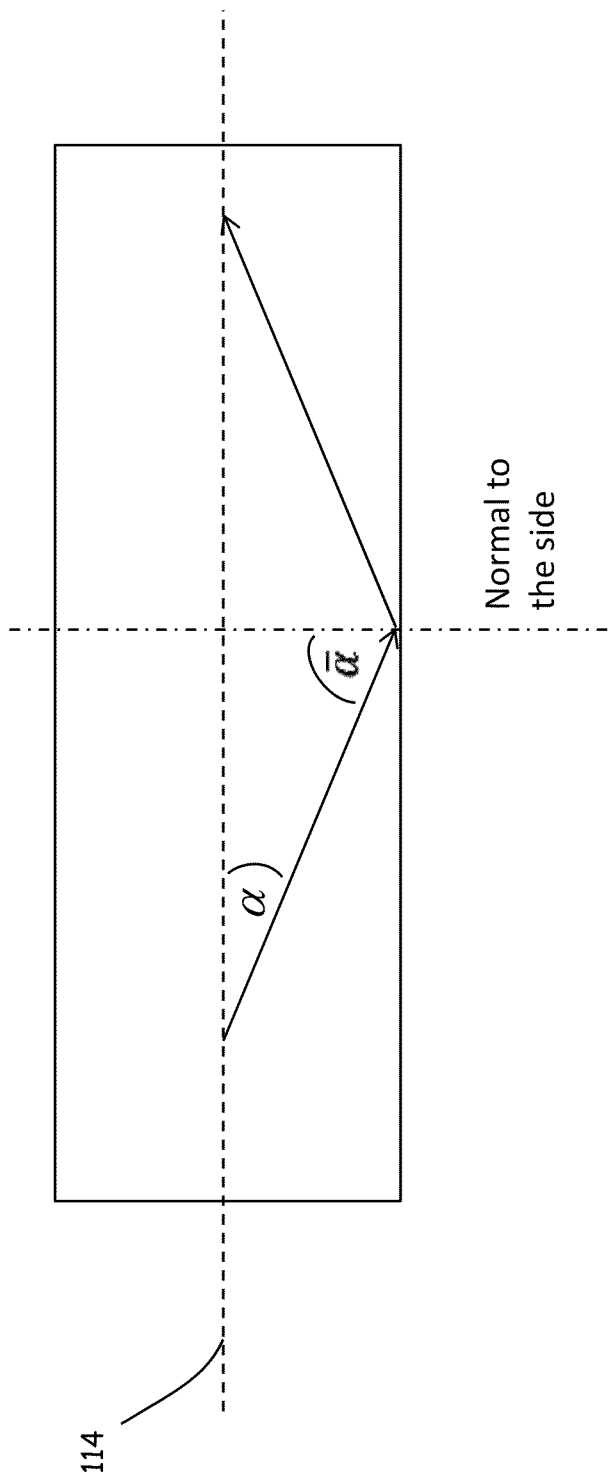
FIG. 1C is a planar schematic view of the amplifier plane of the planar waveguide amplifier shown in FIG. 1A.
Figure 2:
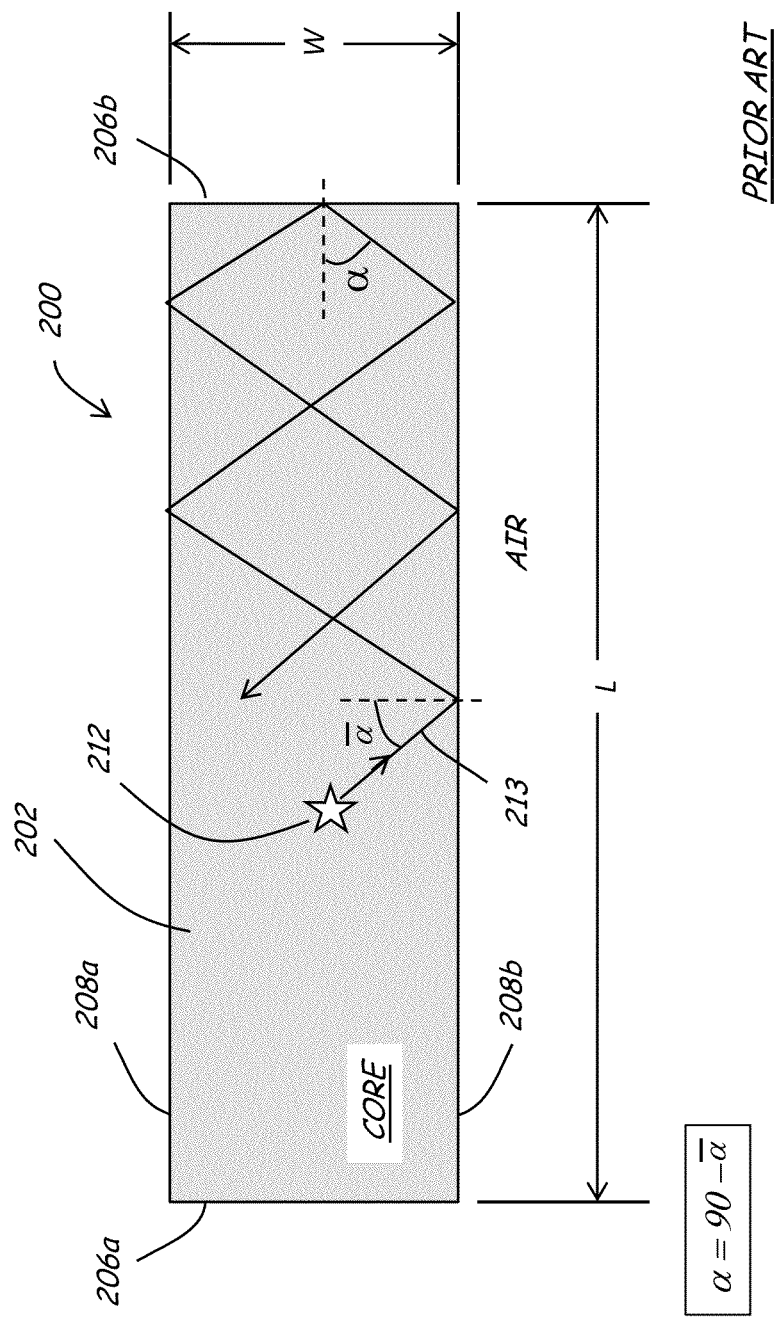
FIG. 2 is a planar schematic view of an embodiment of a planar waveguide amplifier supporting a total internal reflection loop.
Figure 5:
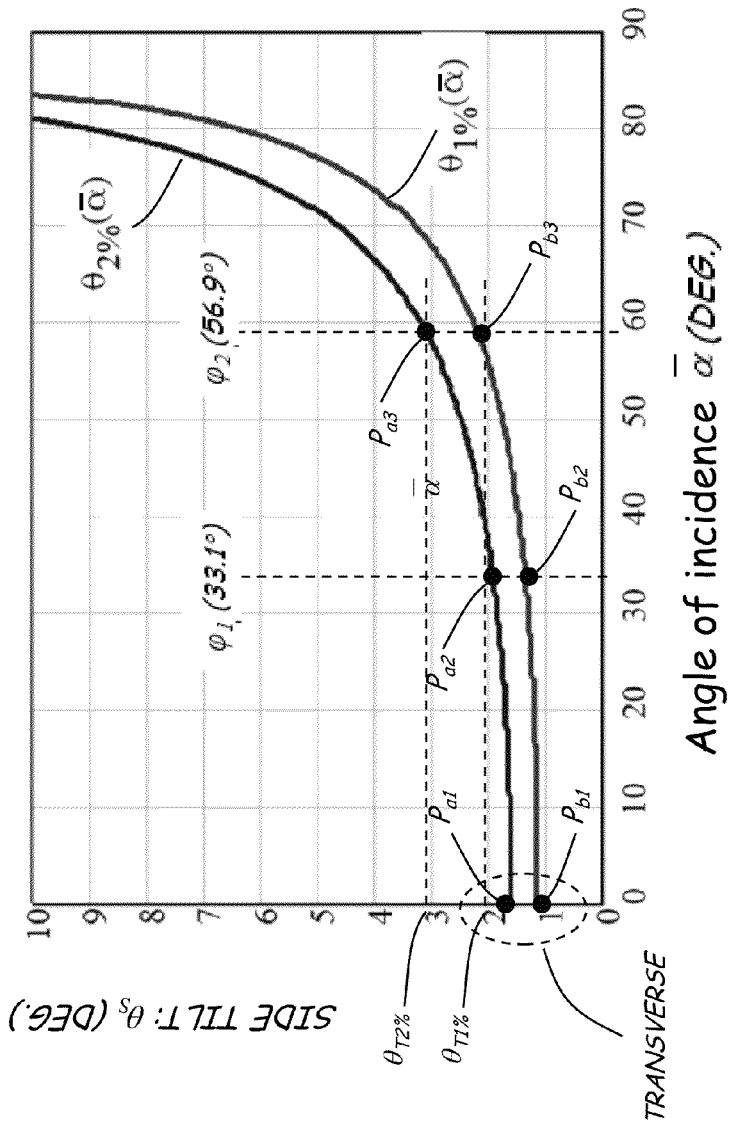
FIG. 5 is a graphical illustration of a relationship between an edge facet angle, or bevel angle of at least one edge facet of a planar waveguide amplifier versus in-plane angles of incidence (AOI) for amplified spontaneous emission impinging upon the at least one angled edge facet.

Having established angular variations imparted on a photon 412 encountering a angled side facet 408, and also understanding a relationship for a critical angle $\gamma_c$ of such guided mode photons within a planar waveguide amplifier 400, a relationship can be established between one or more angles of incidence (e.g., the in-plane angle of incidence $\bar{\alpha}$) and a threshold edge bevel angle $$\theta_T = \frac{(1 + K_\alpha) NA_{core}}{n_{core}} \quad \text{Eqn. 7}$$

beyond which photons 412 are ejected from the core 402. If $\theta_T = \theta_T(K_\alpha)$, as per Eqn. 7, is implemented for a certain $\alpha$, then beams with beam angles larger than $\alpha$ are ejected from the core upon reflection from the side. FIG. 5 provides a graphical illustration of two numeric examples for the functional relationship stated in Eqn. 7. The threshold angle $\theta_T$ is plotted vs. the in-plane angle of incidence $\bar{\alpha}$, as defined in FIG. 1C. The waveguides considered have an active Nd:YAG core and undoped YAG top and bottom claddings. The required increase in refractive index for the core waveguide is coincidentially achieved through the Nd doping. Cases for 1% and 2% doping are shown, where the 2% case makes the stronger waveguide. As can be seen, (a) $\theta_T$ increases when the strength of the waveguide increases, and (b) $\theta_T$ increases monotonically with $\bar{\alpha}$ starting from $\bar{\alpha}=0$.

A left side of the graph corresponds to zero in-plane angles of incidence (i.e., $\bar{\alpha}=0°$ or purely transverse propagation) as illustrated in the example shown and discussed in relation to FIG. 4A. It can be observed that the threshold bevel angle is about 1.1°, illustrated by point $P_{b1}$. This corresponds to the critical angle of the core-cladding interface $\gamma_c$ determined according to $NA_{core}/n_{core}$ as described above, in which $NA_{1\%}$ for Nd:YAG is about 0.036, and the refractive index for YAG is about 1.83. Thus, the half angle of the acceptance cone is $\gamma_c \approx 0.036/1.83$ (i.e., about 1.1°). Likewise, for $NA_{2\%}$ in which $NA_{2\%} \approx \text{sqrt}(2) \cdot NA_{1\%} \approx 1.6°$, illustrated by point $P_{b2}$. As the angle of incidence increases from 0°, the threshold bevel angle $\theta_T$ increases according to the graphical relationship.

The critical angle of TIR for the YAG/air interface is given by $\phi_1 = \text{Arcsin}(n_{air}/n_{yag}) \approx \text{Arcsin}(1/1.83) \approx 33.1°$. It is indicated by a first vertical dashed line in the graph of FIG. 5. Therefore, for any $\bar{\alpha} > \phi_1$ TIR occurs on the long narrow side facet. Since the waveguide is rectangular and the threshold angle $\phi_1$ is less than 45°, it is possible for a beam which experiences TIR on the side facets to experience TIR on the end facets as well (i.e., when $\phi_1 < 45°$) TIR loops can occur. Considering the threshold $\bar{\alpha}$ (i.e., $\phi_1$) is formed along one of the elongated side facets 408 (FIG. 4), the complementary angle at an end facet 406 of a TIR loop is $\phi_2 \approx 90-33.1° \approx 56.9°$. A second vertical dashed line is therefore provided at $\bar{\alpha} = \phi_2 \approx 56.9°$. Thus, any in-plane angle of incidence $\bar{\alpha}$ capable of supporting TIR loops lies within the range $$\phi_1 \leq \bar{\alpha} \leq \phi_2 \quad \text{Eqn. 8}$$

corresponding to the region between the two dashed vertical lines (e.g., $33.1° \leq \bar{\alpha} \leq 56.9°$).

Since $\theta_T$ increases monotonically with $\bar{\alpha}$, $\bar{\alpha} = \phi_2$ needs to be used to calculate the threshold angle $\theta_T$ which insures that all in-plane TIR-loops are rejected from the core. The corresponding threshold bevel angle $\theta_T$ can be read from the graph, having a value of about $\theta_{T1\%} = 2.1°$ (for a 1% Nd doped YAG core) and a value of about $\theta_{T2\%} = 3.1°$ (for a 2% Nd doped YAG core).

The more glancing the in-plane angle of incidence becomes, the larger the threshold side angle needs to be to reject a ray from the core. In various embodiments, there is further utility in increasing the side tilt angles beyond what is needed to suppress TIR loops (e.g., in high gain amplifiers). In various embodiments using high gain amplifiers, fluorescence generated near one end facet and travelling towards the other end-facet may be amplified so strongly that it starts to compete with the pump and, if the gain is high enough, depletes the gain medium near the end facet. For example, in Nd:YAG amplifiers this is observed when the single pass gain exceeds 30 dB. There is therefore benefit in reducing the number of fully guided ASE rays (i.e. rays which experience continuous gain while they travel from end-facet to end-facet. Through strong angling of the sides one can reject from the core all guided ASE rays which hit the sides except for the most glancing ones. In this limit, the effective numeric aperture in the slow axis (SA) approaches the geometric limit of the structure given by $NA_{slow,geometric} = (SA_{width} \ast \text{refractive index})/\text{Length}$.

Accordingly, in at least some embodiments, the side facets 408 are angled at bevel angles $\theta_S$ greater than necessary for avoiding TIR loops. In the above examples, the bevel angle can be chosen to be greater than 2.1° (1%) and greater than 3.1° (2%). For example, the bevel angle can be selected to be greater than 6°. At $\theta_S = 6°$, the corresponding threshold angle of incidence below which ASE is directed out of the core, is about 79° (2% case) and about 74° (1% case). Thus, by rejecting ASE at such large in-plane angles of incidence an effective numerical aperture of the slow axis (i.e., x-axis of FIGS. 4A and 4B) can be reduced. Thus, a slow-axis acceptance cone for guided photons 412 can be narrowed according to a bevel angle of the side facet 408. By reducing the effective slow-axis NA, the unwanted ASE power emerging from the core section of the end-facets 406 can be reduced. For in-plane angles of incidence $\bar{\alpha}$ approaching 90° (i.e., glancing rays), much larger bevel angles $\theta_S$ are required. In general, in a high gain amplifier, the power in an ASE cone emerging from the core at one end-facet originates mainly from guided fluorescence photons which were generated near the opposing end-facet. Such an ASE cone can be narrowed through sufficiently large side angles, such that ASE is essentially limited to ballistic (i.e., end facet to end facet) photons (i.e., photons which do not interact with the sides). It will be apparent in view of this disclosure that, in various embodiments, photons with $\bar{\alpha}$ very close to 90° may not be sufficiently deflected by the angled side to reach a non-guided state.

As illustrated in FIG. 5, $\phi_1$ and $\phi_2$ mark a range in which TIR loops would occur in standard rectangular slab made from YAG. The side tilt given for $\phi_2$ is a minimum requirement for a TIR-loop free amplifier in the particular examples illustrated by FIG. 5. Side angling reduces the effective slow-axis numeric aperture (saNA) of the core-waveguide. Increasing the side angle beyond what is required by $\phi_2$ further reduces the effective saNA, which further reduces ASE and increases the maximum gain which can be achieved.

As shown in FIG. 5, the closer $\bar{\alpha}$ gets to 90°, the stronger the side angle $\theta_S$ needs to be to throw the photon into a non-guided state. Accordingly, the required side angles may become so large that they are impractical. A sufficient side angle for the example planar waveguide amplifiers described herein may be about 10° to about 12° or greater (e.g., up to 89°; up to 60°, or up to 45°). Any reduction of the slow-axis NA by tailoring the side facet bevel angle in this manner further reduces ASE which, as described hereinabove, can be particularly beneficial for very high gain (e.g., >30 dB) amplifiers.

Although the graphical relationships of in-plane incident angles $\bar{\alpha}$ to side bevel angles $\theta_S$ are described in relation to side facets 408 of an elongated planar rectangular waveguide amplifier 400, the same relationship can be applied to one or more of the end facets 406. An example of angled end facets is illustrated in the planar waveguide amplifier 300 shown in FIG. 3B. Namely, end facets 306a and 306b are angled at an angle $\theta_E$ with respect to a fast axis.

An example of ASE suppression within an embodiment of an ASE-resistant planar waveguide amplifier 600 is shown in the planar and side views of FIGS. 6A and 6B respectively. In general, ASE starting at or close to one of the end-facets 606 limits performance of such an amplifier 600. Two spontaneously generated photons 612', 612" are illustrated, occurring near one end of the amplifier 600. A first one of the photons 612' is directed along a first trajectory 613a', which first encounters a side facet 608 at point $P_1$. Such a photon 612' is capable of generating ASE as it travels along the trajectory 613a' within the gain medium of the core 602. The trajectory forms an in-plane angle of incidence $\bar{\alpha}_1$ with the side facet at point $P_1$. The side facet 608 is angled at $\theta_S$, chosen to be sufficiently greater than a threshold bevel angle $\theta_T$ such that photons approaching along in-plane angle of incidence $\bar{\alpha}_1$ for the amplifier 600 are ejected from the core 602. Accordingly, photons approaching along 613a' are redirected at $P_1$ along a different trajectory 613b'. In particular, given the bevel angle $\theta_S$ is at or above the threshold bevel angle $\theta_T$ for the in-plane angle of incidence $\bar{\alpha}_1$, the ASE is redirected along the trajectory 613b' into at least one of the upper and lower claddings 604a, 604b (generally 604). That portion of the trajectory 613b' residing in the cladding 604 is represented by a dashed line. Likewise, ASE approaching point $P_2$ along a first trajectory 613a" is redirected at point $P_2$ along a second trajectory 613b". Once again, if the side bevel angle $\theta$ is at or above the threshold bevel angle $\theta_T$ for the in-plane angle of incidence $\bar{\alpha}_2$, the ASE is redirected along the trajectory 613b" into the cladding 604, represented by the dashed line. Preferably, the ASE after having been ejected from the core 602, exits one of the edges, such as the end facet 606. As shown in FIG. 6A, ASE 620' and 620" exits from one or more of the upper and lower claddings 604 at one or more of the opposing end facets 606.

In this manner, ASE reflected from the side walls can be "rejected" from the gain medium (i.e., the core 602) through sufficiently large edge bevel angles $\theta$. For example, referring once again to FIG. 5, ASE with rays near glancing, having in-plane angles of incidence $\bar{\alpha} \geq 80°$, require respective minimum edge bevel angles of at least about 7° and at least about 9° for Nd concentrations of 1% and 2% respectively in a Nd doped YAG core. High gain amplifiers can be configured as relatively long and narrow to minimize the effective NA for the slow axis. In order to achieve the maximum gain efficiency (i.e., gain in dB per required pump power at high gains) for a given slow axis width to amplifier length ratio, side angles may be chosen large enough to reject beams which propagate with angle $\alpha \leq \text{atan}(W/L)$ where W is the slow axis width and L is the length of the slab as shown, for example, in FIG. 3.

Figure 7A:
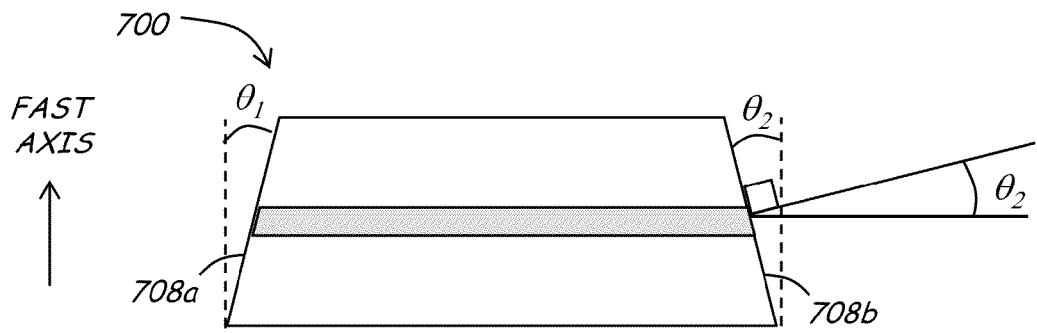
FIG. 7A is a schematic diagram illustrating a transverse cross-sectional view of an embodiment of an ASE-resistant planar waveguide amplifier.

In at least some embodiments, the transverse cross section is uniform along the elongated (optical) axis of the planar waveguide amplifier, although it will be apparent in view of this disclosure that the cross-section may also vary along the optical axis. Some examples of various cross sections are provided in the figures below. FIG. 7A is a schematic diagram illustrating a transverse cross-sectional view of an embodiment of an ASE-resistant planar waveguide amplifier 700. In the illustrative embodiment, the waveguide amplifier 700 has a trapezoidal transverse cross section. A first side facet 708a is provided with a first bevel angle $\theta_1$ measured with respect to a fast axis, and a second side facet 708b is provided at a second bevel angle $\theta_2$ also measured with respect to the fast axis. In some embodiments, each of the respective side bevel angles is substantially the same, i.e., $\theta_1 = \theta_2$. In other embodiments, each of the respective side bevel angles differ with respect to each other, i.e., $\theta_1 \neq \theta_2$. Control of ASE within the waveguide 700 can be accomplished at least in part by selection of the bevel angles for a given waveguide structure, to selectively remove ASE from a gain region of the waveguide according to the techniques described herein.

Figure 7B:
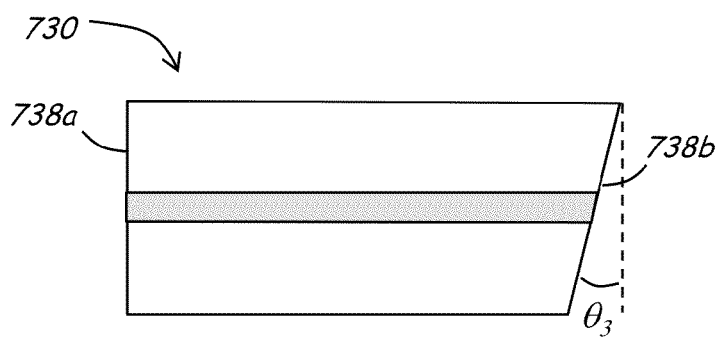
FIG. 7B is a schematic diagram illustrating a transverse cross-sectional of another embodiment of an ASE-resistant planar waveguide amplifier.

FIG. 7B is a schematic diagram illustrating a transverse cross-sectional of another embodiment of an ASE-resistant planar waveguide amplifier 730. In the illustrative embodiment, the waveguide amplifier 730 has a transverse cross section with one perpendicular edge facet 738a and one angled edge facet 738b. Control of ASE within the waveguide 730 can be accomplished at least in part by selection of the bevel angle $\theta_3$ of the single angled edge facet 738b, to selectively remove ASE from a gain region of the waveguide according to the techniques described herein.

Figure 7C:
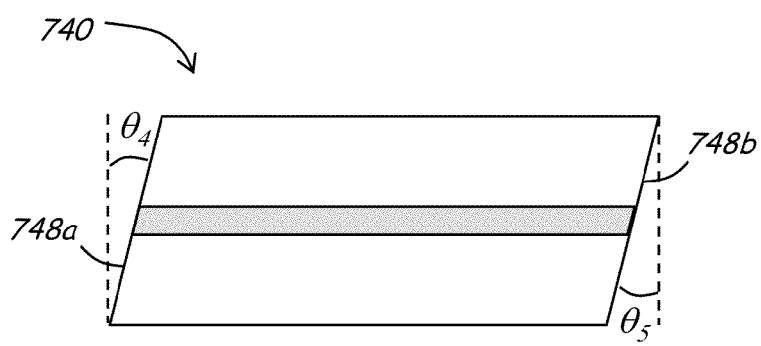
FIG. 7C is a schematic diagram illustrating a transverse cross-sectional of yet another embodiment of an ASE-resistant planar waveguide amplifier.

FIG. 7C is a schematic diagram illustrating a transverse cross-sectional of yet another embodiment of an ASE-resistant planar waveguide amplifier 740. In the illustrative embodiment, a transverse cross section of the waveguide amplifier 740 forms a quadrilateral. A first side facet 748a is provided with a first bevel angle $\theta_4$ measured with respect to the fast axis, and a second side facet 748b is provided at a second bevel angle $\theta_5$ also measured with respect to the fast axis. In some embodiments, each of the respective side bevel angles differ, i.e., $\theta_4 \neq \theta_5$. In other embodiments, each of the respective side bevel angles is substantially the same, i.e., $\theta_4 = \theta_5$, in which case the transverse cross section of the amplifier 740 forms a parallelogram. Control of ASE within the waveguide 740 can be accomplished at least in part by selection of the bevel angles $\theta_4$, $\theta_5$ for a given waveguide structure, to selectively remove ASE from a gain region of the waveguide according to the techniques described herein.

Various embodiments in which bevel angles of one or more of the angled side and/or end facets are non-equal provide further advantages by reducing the ability for rejected light to couple back into the core. In at least some embodiments, the difference between side facet bevel angles is $$\delta\theta_S \geq \frac{(1+K_\alpha)NA}{2n_{core}},$$

where NA is the numeric aperture of the core waveguide, $n_{core}$ is the refractive index of the core and the value of $K_\alpha$ is the value required to break all TIR loops. Therefore, $K_\alpha$ can be calculated from a known range of parasitic loop geometries, e.g., the angles for rejecting parasitic TIR loops from a core as discussed above with reference to FIGS. 4A and 4B and equations 1-8. In further embodiments, the difference between end facet bevel angles is $$\delta\theta_\varepsilon \geq \frac{(1+K_\alpha)NA_{PWG}}{2n_{core}}$$

Such an angular difference requirement on the bevel angles breaks symmetries, which would otherwise tend to facilitate the coupling of rejected ASE back into the core.

Figure 8:
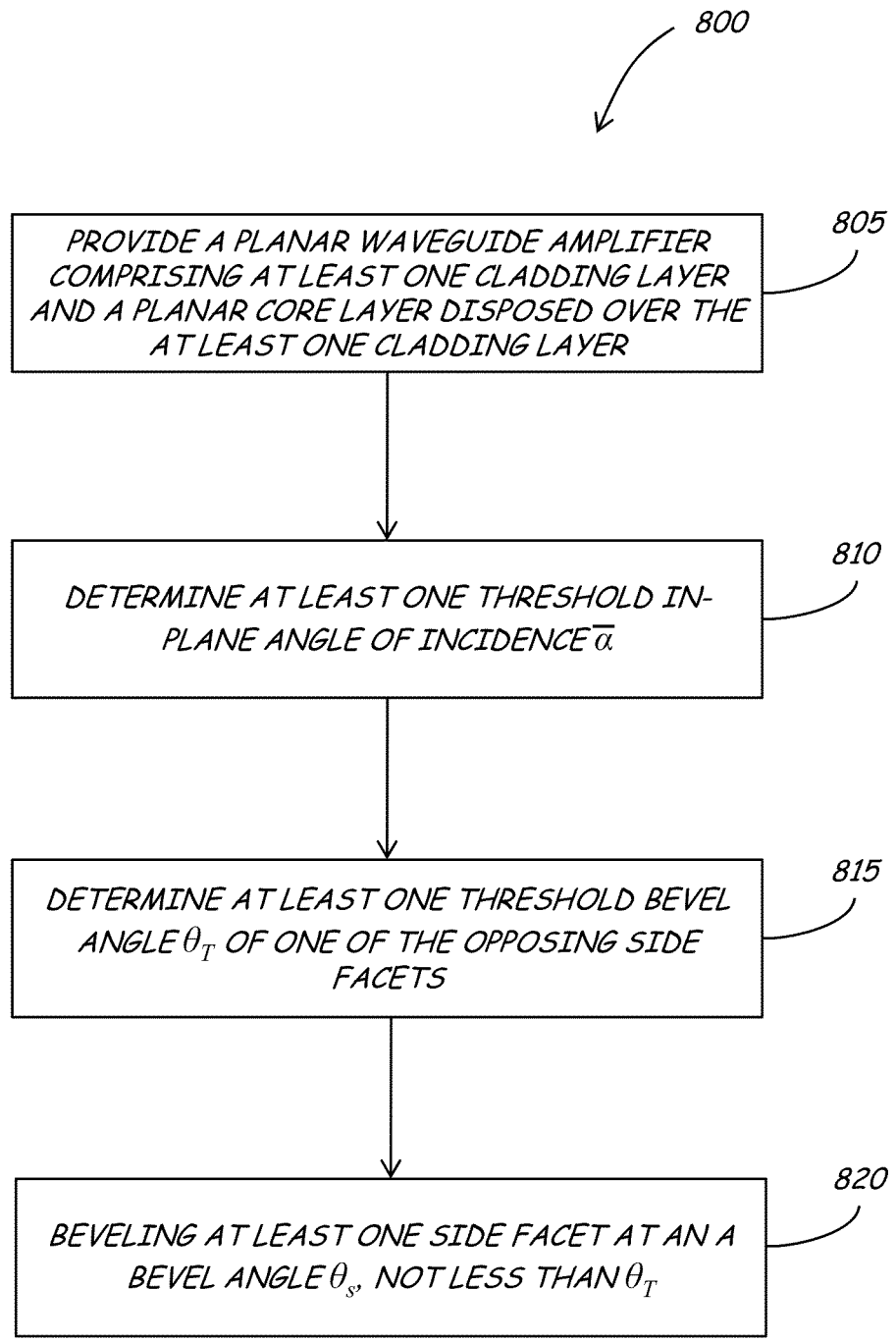
FIG. 8 is a flow diagram illustrating a process for suppressing ASE within an ASE-resistant planar waveguide amplifier.

FIG. 8 is a flow diagram illustrating a process 800 for mitigating ASE in a planar waveguide amplifier. At 805 a planar waveguide amplifier is provided, comprising at least one cladding layer and a planar core layer disposed over the at least one cladding layer. At 810 at least one threshold in-plane angle of incidence α, is determined. At least one threshold bevel angle $\theta_T$ of one of the opposing side facets is determined at 815, and at least one side facet is angled at a bevel angle $\theta_S$, not less than the threshold bevel angle $\theta_T$ at 820.

Figure 9:
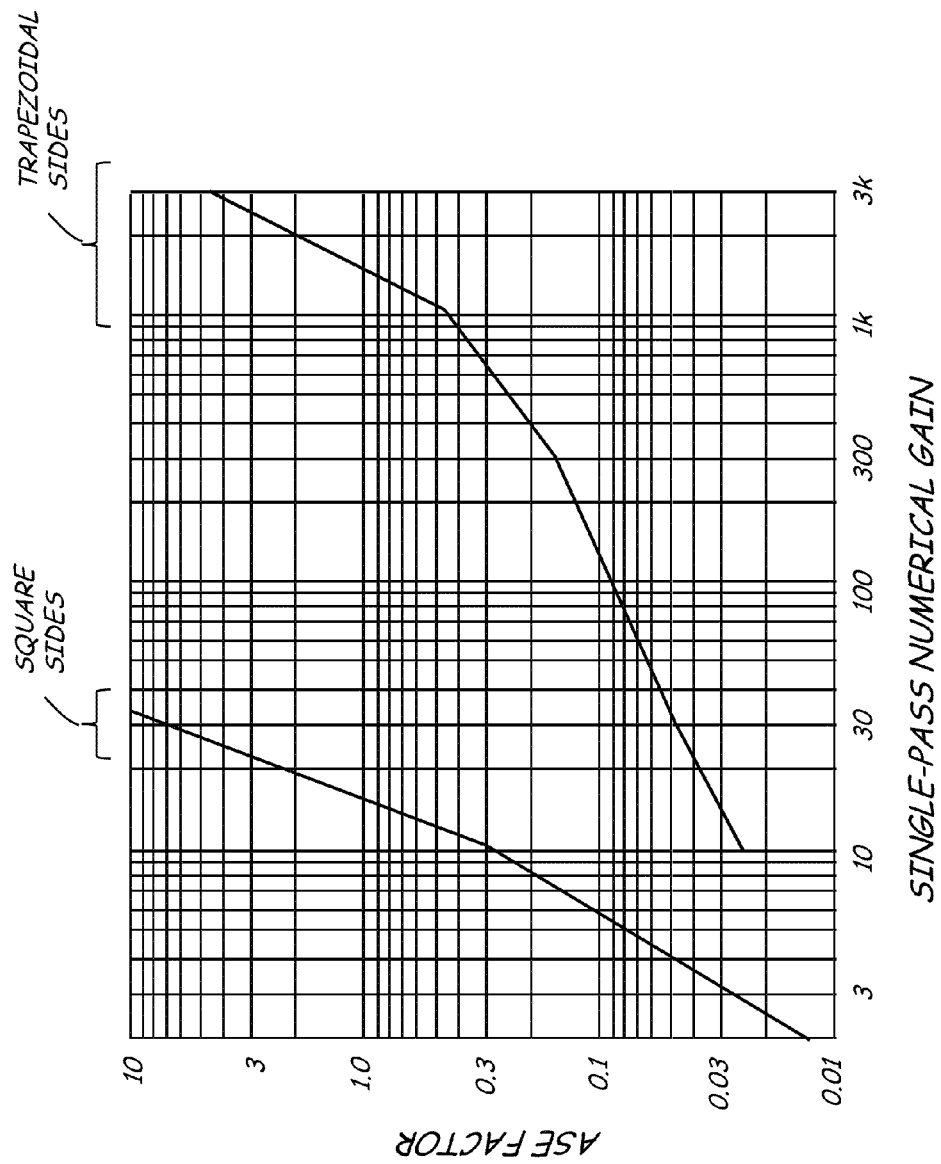
FIG. 9 is a theoretical performance comparison of a 1% Nd:YAG planar waveguide amplifier having a rectangular transverse cross section versus an ASE-resistant planar waveguide amplifier having a trapezoidal transverse cross section.

FIG. 9 is a performance comparison of a planar waveguide amplifier having a rectangular transverse cross section, versus a planar waveguide amplifier having a trapezoidal transverse cross section. The curves are based upon a model prepared by generating a number of random rays within a core and tracking the rays until they decay. The model assumes uniform gain, Fresnel reflections, optical coatings, but not diffuse edge scattering. A vertical axis is labeled "ASE Factor" and represents a ratio of ASE power to fluorescence power. A value of 1 indicates a point at which the ASE power is equal to the fluorescent power. In general, the ASE power can be obtained by multiplying a fluorescence power by the ASE factor. A horizontal axis is labeled "Single-Pass Numerical Gain" and represents signal gain associated with a single, end-to-end pass of a weak input signal through the planar waveguide amplifier. It can be observed from the graph that the ASE factor generally increases with the gain.

For comparison, a 1% Nd doped YAG amplifier was modeled with square sides and angled sides. It can be observed from the graph that the ASE power approaches the fluorescent power at a low single-pass numerical gain of only about 15 (12 dB). By way of comparison, the numerical gain achievable for a similar waveguide amplifier having a trapezoidal transverse profile with side facets angled at only about 2° is about 1,500 (32 dB). Thus, simply providing smooth angled side edges provides a performance improvement of about 20 dB in achievable gain. While the side angle in this illustrative embodiment was deliberately given the minimum value required to break all TIR loops, it will be apparent in view of this disclosure that further reduction of ASE power will result in additional performance improvements (e.g., increased achievable numerical gain). Accordingly, such additional performance improvements may be realized by increasing the side angle beyond the minimum value required to break all TIR loops as described above with reference to FIGS. 3-6.

It will be apparent in view of this disclosure that providing angled side facets can be very effective in breaking up parasitic lasing loops in the high gain core by "rejecting" or otherwise redirecting them into the low gain volume (e.g., the cladding) of the planar waveguide amplifier. Once the TIR ray has been rejected into the cladding, a non-guided TIR loop may continue to exist and the ray may eventually, after multiple reflections, be redirected back into a core-guided state. This is undesirable and therefore, in some embodiments, a loss mechanism is provided for the rejected ray. Prevention of such unwanted reentry of previously rejected ASE can be accomplished by way of subjecting the rejected light to one or more loss mechanisms. For example, one or more of the cladding layers of a planar waveguide amplifier, or at least a portion of any such layer, can include (e.g., be impregnated with) a loss mechanism to attenuate or otherwise reduce ASE directed therein.

FIG. 10 is a schematic diagram illustrating an edge portion of a transverse cross section of an embodiment of a rectangular, ASE-resistant planar waveguide amplifier including at least one loss mechanism. A planar waveguide amplifier 900 includes a planar core layer 902 surrounded above and below by adjacent cladding layers 904a, 904b (generally 904). In at least some embodiments, it is desirable to provide one or more thermal transfer elements, such as heat sinks, to assist with removal of heat from the core-cladding portion of the waveguide. One or both of the two large exterior faces of such planar waveguide amplifiers can be used in such a manner to remove excess heat generated during operation.

A respective planar region along each interface between an outer surface of each respective cladding layer and an adjacent surface of a heat sink can be referred to as a thermo-optic interface (TOI). A TOI may, in some examples, have certain refractive properties determined by the laser architecture. In particular embodiments there may be a refractive index barrier with a refractive index, $n_b$, lower than the cladding refractive index. Light which hits this interface with sufficiently large angles of incidence experiences TIR. This is, for example, used to confine pump light to the slab volume and keep it away from unwanted loss mechanisms in the TOI.

In the illustrative example, a first thermal transfer member (heat sink) 911a is provided adjacent to an outer surface of the upper cladding layer 904a. A second heat sink 911b is similarly provided adjacent to an outer surface of the lower cladding layer 904b. A respective planar region along each interface between an outer surface of each respective cladding layer 904 and an adjacent surface of the heat sink 911a, 911b (generally 911), creates a TOI 910a, 910b (generally 910). At least one constraint on such a TOI 910 is that the pump power be virtually unaffected or at least minimally affected by its presence. This is usually achieved by depositing a thin non-absorptive layer of refractive index material (e.g., gel or paste or coating) having a refractive index just low enough to contain the pump light within planar waveguide amplifier volume. Such coatings are sometimes referred to as evanescent-wave or e-wave coatings. Thus, rays near glancing do not penetrate into the TOI 910. Beneficially, such a TOI 910 can provide a loss mechanism, thereby increasing the gain threshold for unwanted parasitic laser oscillations related to initially rejected TIR loops which may find their way back into the core 902 after multiple reflections. In general and as shown in FIG. 10, the loss region of the TOI 910 can be accessed when $\overline{\gamma_3} > \mathrm{asin}(n_b/n_{cladding})$, wherein $n_b$ is the refractive index of the e-wave coating and $n_{cladding}$ is the refractive index of the cladding. For embodiments using this loss mechanism, the side facet bevel angles $\theta_S$ may advantageously be chosen to be sufficiently large such that rejected parasitic TIR loops can access the loss in the TOI.

An example of a spontaneously generated photon 912 gives rise to ASE propagating within the core 902 along a direction 913a. Having chosen a sufficiently large side facet bevel angle θ$_S$, the ASE is redirected at point P into another direction, encountering the core-cladding interface at an angle of incidence $\overline{\gamma_2}$, which is preferably below the critical angle, allowing at least a portion of the ASE to enter the cladding 904. The ASE redirected into the cladding travels along its new direction 913b, until it encounters the TOI 910a. Another critical angle can be determined between the cladding 904a and the TOI 910a at an angle $\overline{\gamma_3}$. For angles $\overline{\gamma_3}$ below a critical angle of the interface, at least a portion of the ASE enters the TOI 910a, as illustrated. Thus, side angles can be selected not simply to reject ASE from the core, but to further redirect such rejected ASE into another medium, such as the TOI 910. Since the angular properties of the parasitic loops are generally understood, it is possible to calculate the side facet bevel angles required. Such bevel angles are generally greater than the bevel angles for the embodiments described above without consideration of any TOI 911. If the TOI 910 is used as a primary absorber for rejected TIR loop light, then the side angle, θ$_S$, should be large enough such that rejected rays from TIR-loops, can pass through the e-wave coating and penetrate into the absorptive volume of the TOI 910.

Figure 11:
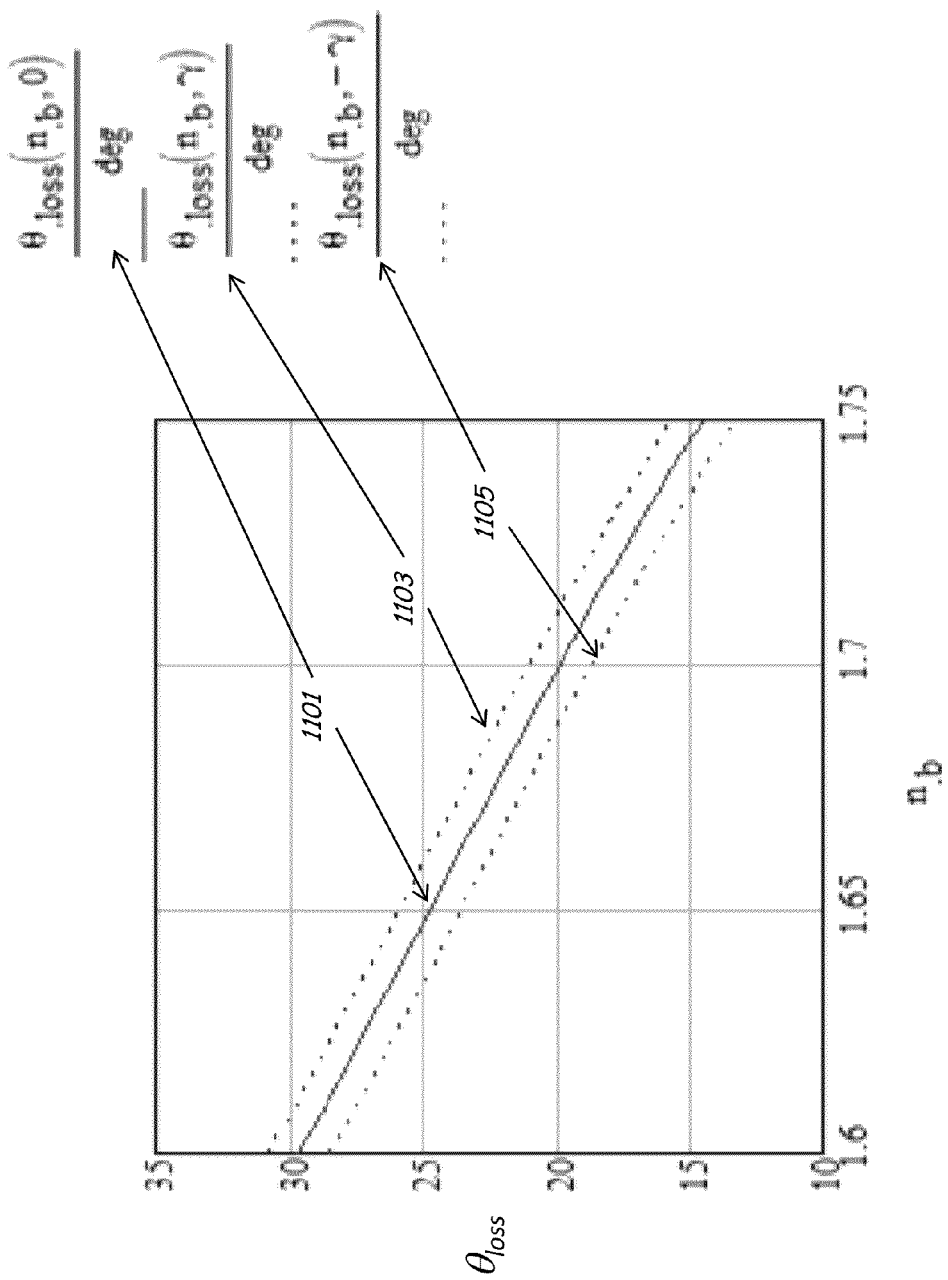
FIG. 11 is a graphical illustration of a relationship between an edge facet angle, or bevel angle of at least one edge facet, of a planar waveguide amplifier versus the refractive index of an e-wave coating material disposed between a cladding layer and a thermo-optic interface.

FIG. 11 illustrates the minimum required side tilt, shown as θ$_{loss}$ on the ordinate, necessary for all rejected TIR loops to access the loss in the TOI. As shown in FIG. 11, θ$_{loss}$ is dependent on the refractive index of an e-wave coating, shown as n$_b$ on the abscissa. As described hereinabove, an e-wave coating separates the cladding from the TOI. The required side angle also depends slightly on the strength of the waveguide. In FIG. 11, θ$_{loss}$ is illustrated for out of plane beam angles γ in YAG, which has a refractive index of 1.82. In the example embodiments illustrated by FIG. 11, γ is the out-of plane angle of the marginally guided ray for a waveguide of numeric aperture of 0.04.

The solid central line 1101 corresponds to θ$_{loss}$ for an out of plane beam angle γ of 0° (i.e., parallel to the waveguide plane). The upper dashed line 1103 corresponds to θ$_{loss}$ for a positive beam angle γ (i.e., inclined relative to the waveguide plane) and the lower dashed line 1105 corresponds to θ$_{loss}$ for a negative beam angle −γ (i.e., declined relative to the waveguide plane). In order to calculate θ$_{loss}$(n$_b$, 0) 1101, θ$_{loss}$(n$_b$, γ) 1103, and/or θ$_{loss}$(n$_b$, −γ) 1105 a relationship between θ$_{loss}$ and γ must be determined as described below.

In order to use the loss mechanism in the TOI to eliminate fluorescence photons from rejected TIR loops, the angle of incidence $\overline{\gamma}$ on the TOI has to be made sufficiently small (i.e., more perpendicular to the TOI) so that the ray no longer experiences TIR at this interface. This is achieved by making the side angle θ$_S$ sufficiently large. It is again the more glancing of the two angles of incidence, φ$_2$ in the inequality in Eqn. 8 which has the most stringent requirements and, therefore, is advantageously used to set the side angle.

To determine the appropriate side angles, a loss function, $f_{loss}$, is defined as:

$$f_{loss}(\varphi_2, \gamma, \theta) = \cos(\gamma_r(\varphi_2, \gamma, \theta)) \cdot \frac{n_{core}}{n_b} \quad \text{Eqn. 9}$$

where γ$_r$(φ$_2$, γ, θ) is described above in Eqn. 5 and φ$_2$ is described above in Eqn. 8.

For $f_{loss}$<1, rays rejected from the core are able to penetrate into the TOI. Otherwise, TIR occurs at the TOI interface. In satisfying this requirement, the condition $f_{loss}$<1 must remain true for all guided values of γ, which are described by the inequality $$|\gamma| \leq \sin^{-1}\left(\frac{NA_{core}}{n_{core}}\right)$$

as explained above.

Referring again to FIG. 10, in some embodiments the TOI 910 is provided by a relatively narrow air gap between an outer surface of the cladding 904 and the adjacent heat sink 911. Alternatively or in addition, the relatively narrow gap can include a material, such as a thermally conductive material (e.g., paste) to promote heat transfer between the cladding and the heat sink 911.

Other loss mechanisms include absorptive claddings (i.e., volume absorbers within the cladding), which are preferentially absorptive for the laser light but not for the pump light. Such materials include, for example Sm-doped YAG, which is absorptive for the signal/ASE near 1.06 µm but transparent for the pump light, typically near 0.8 µm. Alternatively or in addition absorptive, high refractive index coatings or materials can be provided in optical contact with the planar waveguide amplifier, to allow light from rejected TIR loops to penetrate into the coating and suffer absorption. Again, in these cases, the γ value after rejection from the core must be sufficiently large to be able to enter the coatings. Alternatively or in addition and as shown in FIG. 6B, at least some portions of the side facets can be roughened, for example where the pump intensity is relatively low, such that any resulting pump losses would also be low (e.g., roughened at portions of the side facets near a pumped end, where the pump usually underfills the cross-section of the slab). Contrary to the devices and techniques described herein, amplifier structures having all-polished sides have previously been avoided because of the high risk (and expectation) that a closed loop parasitic exists which will destroy amplifier performance. However, PWG structures having all-polished sides in accordance with various embodiments maximize efficiency, gain, and ability to store energy. Herein we describe that an optimum design rejects slow axis guided TIR loops from the guiding core into the cladding and then provides loss mechanisms for the rejected light. The loss is such that any lasing thresholds associated with such light is so high that lasing thresholds will never be reached due to the fundamental gain limit imposed by ballistic photons. Such optimum structures can be realized in two- and three-part sandwich structures with properly chosen angles on side and end facets. In general, it is desirable to avoid ground surfaces because they lead to inefficiencies and uncertain ray trajectories. In limited circumstances, where pump light does not (or very little) interact with the ground surfaces, ground surfaces can be beneficially employed to provide loss mechanisms for parasitic ray traces.

Using edge facet angle techniques, such as those described herein, it is possible to eliminate parasitic modes and allow for high power, high gain and high efficiency operation of planar waveguide amplifiers. It is thereby possible to reach the fundamental performance limit where ballistic photons (i.e., photons which travel the length of the amplifier without interacting with the sides) are amplified so strongly that they deplete the gain medium. By way of example, side and end-angled devices which have achieved parasitic free single pass gains up to 45 dB and extracted energies up to 90 mJ have been demonstrated. When, compared to a device of the same core and cladding geometry with ground, non-angled sides, such angled devices achieved a reduction in the required pump power by 40%. Generally, an all-polished, side-angled slab having a two- or three-part sandwich structure exhibits reduced required pump power compared to other structures with similar core and cladding volumes having side claddings and/or ground sides instead.

The devices and techniques described herein can be used in various applications including any application in which a planar waveguide amplifiers can used. Such applications include the power amplifier portion of a master oscillator power amplifier (MOPA) laser device, photoconductive switches, ignition devices, materials processing (e.g., peening, welding, drilling, cutting), laser radar, and/or other optical communication and interrogation devices. Additional applications include amplification of short pulse lasers. For many such applications which use high average power systems, the increased optical efficiency is of importance as excess heat in the gain medium is minimized and therefore beam distortion through the temperature dependent refractive index (dn/dT) is minimized.

Whereas many alterations and modifications of the disclosure will no doubt become apparent to a person of ordinary skill in the art after having read the foregoing description, it is to be understood that the particular embodiments shown and described by way of illustration are in no way intended to be considered limiting. Further, the subject matter has been described with reference to particular embodiments, but variations within the spirit and scope of the disclosure will occur to those skilled in the art. It is noted that the foregoing examples have been provided merely for the purpose of explanation and are in no way to be construed as limiting of the present disclosure.

While the present disclosure has been described with reference to example embodiments, it is understood that the words that have been used herein, are words of description and illustration, rather than words of limitation. Changes may be made, within the purview of the appended claims, as presently stated and as amended, without departing from the scope and spirit of the present disclosure in its aspects.

Although the present disclosure has been described herein with reference to particular means, materials and embodiments, the present disclosure is not intended to be limited to the particulars disclosed herein; rather, the present disclosure extends to all functionally equivalent structures, methods and uses, such as are within the scope of the appended claims.

I claim:

1. A planar waveguide amplifier, comprising:
   at least one cladding layer; and
   a planar core layer disposed over the at least one cladding layer, each of the planar core layer and the at least one cladding layer extending longitudinally between opposing end facets of the planar waveguide amplifier and laterally between opposing side facets of the planar waveguide amplifier, the planar core layer and the at least one cladding layer being mutually adapted to support guided photons within the planar core layer,
   wherein at least one threshold in-plane angle of incidence $\bar{\alpha}$ is formed by photon trajectories impinging upon at least one of the opposing side facets within the planar core layer, beyond which total internal reflection (TIR) loops within the planar core layer can be supported,
   wherein at least one of the opposing side facets is angled at a bevel angle $\theta_S$ measured with respect to a plane perpendicular to the planar core layer,
   wherein the guided photons are configured to be ejected from the planar core layer after interacting with at least one of the opposing side facets having the bevel angle $\theta_S$ greater than a threshold bevel angle $\theta_T$ of one of the opposing side facets measured with respect to a plane perpendicular to the planar core layer, the threshold bevel angle $\theta_T$ being determined, from the at least one threshold in-plane angle of incidence $\bar{\alpha}$ of the photon trajectories, according to $$\theta_T = \frac{(1+K_\alpha)NA_{core}}{n_{core}},$$

wherein $NA_{core}$ is the fast-axis numerical aperture of the planar core layer, $n_{core}$ is the index of refraction of the planar core layer, and $K_\alpha$ is a positive scalar quantity, wherein guided photons after interaction with the angled side remain guided when $$|\gamma_r| \leq \frac{NA_{core}}{n_{core}},$$

where $\gamma_r = \gamma_r(\alpha, \gamma, \theta_S) = \text{Atan}(\psi(\alpha, \gamma, \theta_S))$, where $\psi(\alpha, \gamma, \theta) = \frac{k_r(\alpha, \gamma, \theta) \cdot n_{core}}{|k_r(\alpha, \gamma, \theta) \times n_{core}|}$, where $k_r(\alpha, \gamma, \theta) = k(\alpha, \gamma) - 2(n_{side}(\theta) \cdot k(\alpha, \gamma)) \cdot n_{side}(\theta)$, where $k(\alpha, \gamma) = \begin{bmatrix} \sin(\alpha) \\ \sin(\gamma) \\ \sqrt{1-\sin(\alpha)^2 - \sin(\gamma)^2} \end{bmatrix}$ and $n_{side} = \begin{bmatrix} \cos(\theta) \\ \sin(\theta) \\ 0 \end{bmatrix}$, wherein $\bar{\alpha}$ is an angle of incidence between one or more of the opposing side facets and an in-plane trajectory of at least one photon, $\alpha$ is a complementary angle of $\bar{\alpha}$, $\gamma$ is an angle between the planar core layer and an out of plane trajectory of the at least one photon, $\theta = \theta_S$, and $K_\alpha$ monotonically increases with $\bar{\alpha}$ in the range $0 < \bar{\alpha} < 90°$.

2. The planar waveguide amplifier of claim 1, wherein a transverse cross section of the planar core layer and the at least one cladding layer defines a shape selected from the group of shapes consisting of: a parallelogram, a trapezoid, an isosceles trapezoid, a trapezium, an isosceles trapezium, and a right-angled trapezium.

3. The planar waveguide amplifier of claim 1, wherein at least a portion of at least one of the opposing side facets is polished.

4. The planar waveguide amplifier of claim 1, wherein at least a portion of at least one of the opposing side facets has a diffused surface.

5. The planar waveguide amplifier of claim 1, wherein the planar core layer is at least one of neodymium-doped yttrium aluminum garnet (Nd:YAG), ytterbium-doped yttrium aluminum garnet (Yb:YAG), erbium-doped yttrium aluminum garnet (Er:YAG), thulium-doped yttrium aluminum garnet (Tm:YAG), holmium-doped yttrium aluminum garnet (Ho:YAG), thulium-holmium-codoped yttrium aluminum garnet (Tm:Ho:YAG), or chromium-doped yttrium aluminum garnet ($Cr^{4+}$:YAG).

6. The planar waveguide amplifier of claim 5, wherein the side bevel angle is not less than about 2 degrees.

7. The planar waveguide amplifier of claim 5, wherein the side bevel angle θhd S is between about 2 and 45 degrees.

8. The planar waveguide amplifier of claim 1, further comprising a lossy media for attenuating amplified spontaneous emissions, wherein the lossy media is at least one of a coating to the at least one cladding layer or impregnated within the at least one cladding layer.

9. The planar waveguide amplifier of claim 8, wherein $\theta_S$ is chosen to satisfy an inequality $f_{loss} < 1$, wherein $f_{loss}$ is determined by $$\frac{n_{core}}{n_b},$$

wherein $n_b$ is the refractive index of the coating to the at least one cladding layer and $\phi_2$ is a maximum $\bar{\alpha}$ at which a total internal reflection loop of a photon is possible.

10. A method for mitigating amplified spontaneous emission in a planar waveguide amplifier comprising the steps of:
   providing a planar waveguide amplifier comprising:
      at least one cladding layer, and
      a planar core layer disposed over the at least one cladding layer, each of the planar core layer and the at least one cladding layer extending longitudinally between opposing end facets of the planar waveguide amplifier and laterally between opposing side facets of the planar waveguide amplifier, the planar core layer and the at least one cladding layer being mutually adapted to support guided photons within the planar core layer;
   determining at least one threshold in-plane angle of incidence $\bar{\alpha}$ formed by photon trajectories impinging upon the side facet within the planar core layer, beyond which total internal reflection (TIR) loops within the planar core layer can be supported
   determining, from the at least one threshold in-plane angle of incidence $\bar{\alpha}$, a threshold bevel angle $\theta_T$ of one of the opposing side facets measured with respect to a plane perpendicular to the planar core layer, wherein $\theta_T$ is determined according to $$\theta_T = \frac{(1 + K_\alpha)NA_{core}}{n_{core}},$$

wherein $NA_{core}$ is the fast-axis numerical aperture of the planar core $n_{core}$ layer, $n_{core}$ is the index of refraction of the planar core layer, and $K_\alpha$ is a positive scalar quantity, wherein the guided photons after interaction with the angled side remain guided when $$|\gamma_r| \le \frac{NA_{core}}{n_{core}},$$

where $y_r(\alpha, y, \theta_T) = \text{Atan}(\Psi(\alpha, y, \theta_T))$, where $\Psi(\alpha, y, \theta) =$ $$\frac{k_r(\alpha, \gamma, \theta) \cdot n_{core}}{|k_r(\alpha, \gamma, \theta) \times n_{core}|},$$

where $k_r(\alpha, y, \theta) = k(\alpha, y) - 2(n_{side}(\theta) \cdot k(\alpha, y)) \cdot n_{side}(\theta)$, where $$k(\alpha, \gamma) = \begin{bmatrix} \sin(\alpha) \\ \sin(\gamma) \\ \sqrt{1 - \sin(\alpha)^2 - \sin(\gamma)^2} \end{bmatrix} \text{ and } n_{side} = \begin{bmatrix} \cos(\theta) \\ \sin(\theta) \\ 0 \end{bmatrix},$$

further wherein $\bar{\alpha}$ is an angle of incidence between one or more of the opposing side facets and an in-plane trajectory of at least one photon, $\alpha$ is a complementary angle of $\bar{\alpha}$, $\gamma$ is an angle between the planar core layer and an out of plane trajectory of the at least one photon, $\theta = \theta_S$, and $K_\alpha$ monotonically increases with $\bar{\alpha}$ in the range $0 < \bar{\alpha} < 90°$; and angling at least one side facet at a bevel angle $\theta_S$ greater than the threshold bevel angle $\theta_T$.

11. The method of claim 10, further comprising polishing at least one of the opposing side facets.

12. The method of claim 10, further comprising applying a diffuse finish to at least one of the opposing side facets.

13. The method of claim 10, further comprising angling both opposing side facets according to the same bevel angle $\theta_S$.

14. The method of claim 10, further comprising impregnating the at least one cladding layer with a lossy media for attenuating amplified spontaneous emissions.

15. The method of claim 10, further comprising disposing a lossy media coating over one or more of the at least one cladding layer for attenuating amplified spontaneous emissions.

16. The system of claim 1, wherein the guided photons are configured to be ejected from the planar core layer after interacting with at least one of opposing end facets having the bevel angle $\theta_S$ greater than a threshold bevel angle $\theta_T$ of one of the opposing end facets measured with respect to a plane perpendicular to the planar core layer.

17. The system of claim 1, wherein which total internal reflection (TIR) loops within the planar core layer can be supported having at least one of the side facets and end facets be unangled.

18. The system of claim 1, wherein the magnitude of $K_\alpha$ is determined by the reflected threshold photon being unguided by the core.

* * * * *